United States Patent
Matsuzawa et al.

(10) Patent No.: US 6,900,551 B2
(45) Date of Patent: May 31, 2005

(54) SEMICONDUCTOR DEVICE WITH ALTERNATE BONDING WIRE ARRANGEMENT

(75) Inventors: Tomoo Matsuzawa, Tokyo (JP); Takafumi Nishita, Iruma (JP); Yasuyuki Nakajima, Tachikawa (JP); Toshiaki Morita, Hitachi (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 10/430,279

(22) Filed: May 7, 2003

(65) Prior Publication Data

US 2003/0218245 A1 Nov. 27, 2003

(30) Foreign Application Priority Data

May 21, 2002 (JP) ........................................ 2002-146321

(51) Int. Cl.[7] .............................................. H01L 23/48
(52) U.S. Cl. ........................ 257/786; 257/782; 257/784
(58) Field of Search ................................. 257/784, 782, 257/734–735, 780, 786, 666; 437/617; 438/617

(56) References Cited

U.S. PATENT DOCUMENTS

| | | | | | |
|---|---|---|---|---|---|
| 5,932,323 | A | * | 8/1999 | Throssel | 428/209 |
| 6,008,532 | A | * | 12/1999 | Carichner | 257/691 |
| 6,025,640 | A | * | 2/2000 | Yagi et al. | 257/666 |
| 6,157,085 | A | * | 12/2000 | Terashima | 257/783 |
| 6,251,694 | B1 | * | 6/2001 | Liu et al. | 438/14 |
| 6,285,077 | B1 | * | 9/2001 | Chia et al. | 257/700 |
| 6,291,898 | B1 | * | 9/2001 | Yeh et al. | 257/786 |
| 6,348,742 | B1 | * | 2/2002 | MacPherson | 257/786 |
| 6,359,341 | B1 | * | 3/2002 | Huang et al. | 257/778 |
| 6,369,407 | B1 | * | 4/2002 | Hikita et al. | 257/48 |
| 6,403,895 | B1 | * | 6/2002 | Sota | 174/260 |
| 6,417,576 | B1 | * | 7/2002 | Ellenberger et al. | 257/787 |
| 6,429,675 | B2 | * | 8/2002 | Bell | 324/765 |
| 6,476,506 | B1 | * | 11/2002 | O'Connor et al. | 257/786 |
| 6,534,879 | B2 | * | 3/2003 | Terui | 257/786 |
| 6,538,336 | B1 | * | 3/2003 | Secker et al. | 257/786 |
| 6,563,196 | B2 | * | 5/2003 | Miyagawa | 257/620 |
| 6,621,140 | B1 | * | 9/2003 | Gibson et al. | 257/531 |
| 6,650,013 | B2 | * | 11/2003 | Yin et al. | 257/736 |
| 6,667,546 | B2 | * | 12/2003 | Huang et al. | 257/691 |
| 6,713,881 | B2 | * | 3/2004 | Umehara et al. | 257/786 |
| 6,734,572 | B2 | * | 5/2004 | Nin | 257/797 |
| 2002/0005592 | A1 | * | 1/2002 | Miyata et al. | 257/784 |

FOREIGN PATENT DOCUMENTS

| | | |
|---|---|---|
| JP | 6-34983 | 2/1994 |
| JP | 11-121526 | 4/1999 |
| JP | 2001-144214 | 5/2001 |

* cited by examiner

*Primary Examiner*—Long Pham
*Assistant Examiner*—Thao X. Le
(74) *Attorney, Agent, or Firm*—Miles & Stockbridge P.C.

(57) ABSTRACT

A semiconductor device comprising a plurality of wires for electrically connecting a plurality of electrode pads arranged on a main surface of a semiconductor chip along one side of the semiconductor chip to a plurality of connecting portions arranged on the main surface of a wiring substrate along one side of the semiconductor chip, respectively, wherein second wires out of the plural wires consisting of first and second wires adjacent to each other have a larger loop height than the first wires, one end portions of the second wires are connected to the electrode pads at positions farther from one side of the semiconductor chip than the one end portions of the first wires, and the other end portions of the second wires are connected to the connecting portions at positions farther from one side of the semiconductor chip than the other end portions of the first wires.

13 Claims, 25 Drawing Sheets

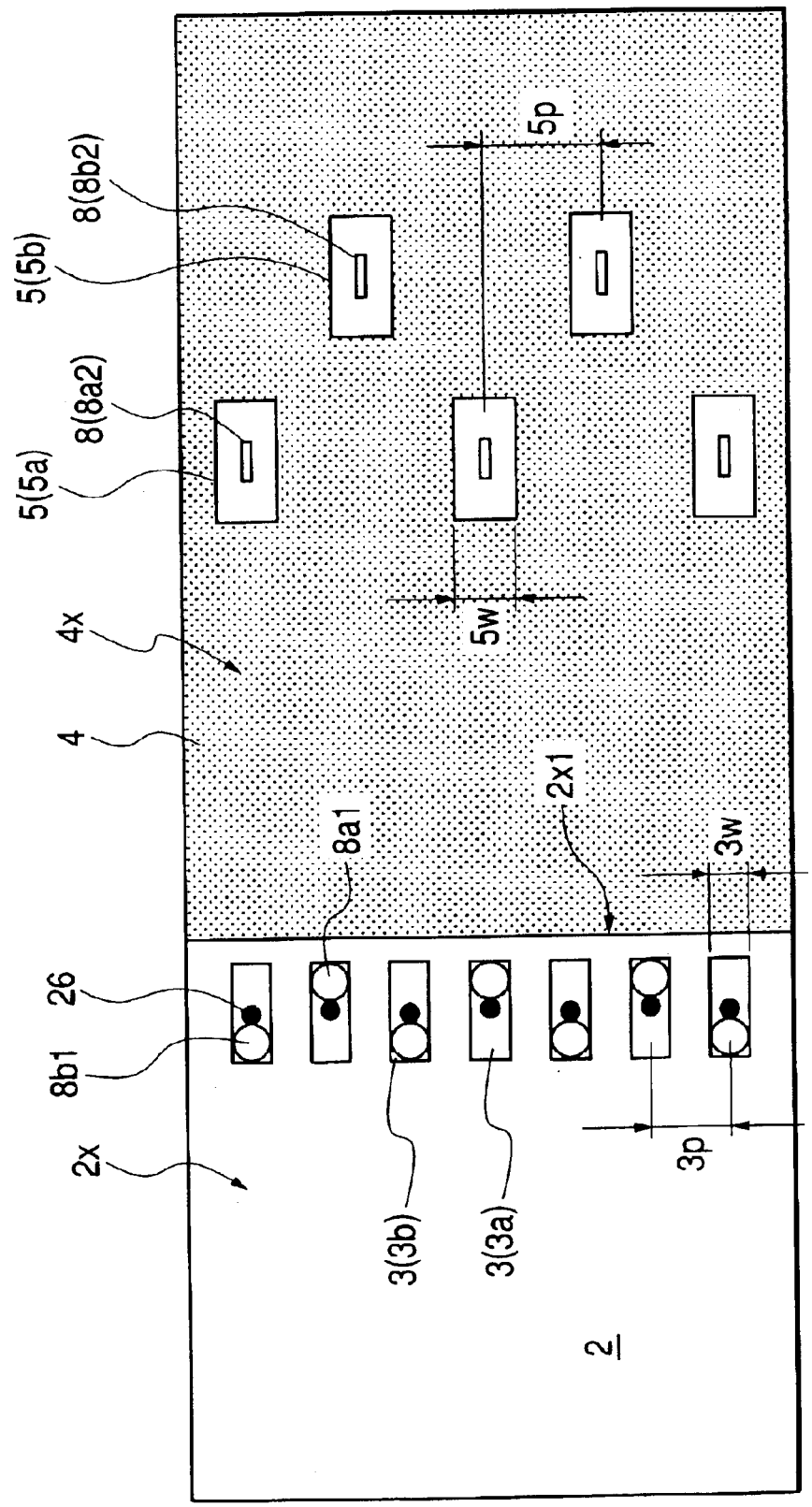

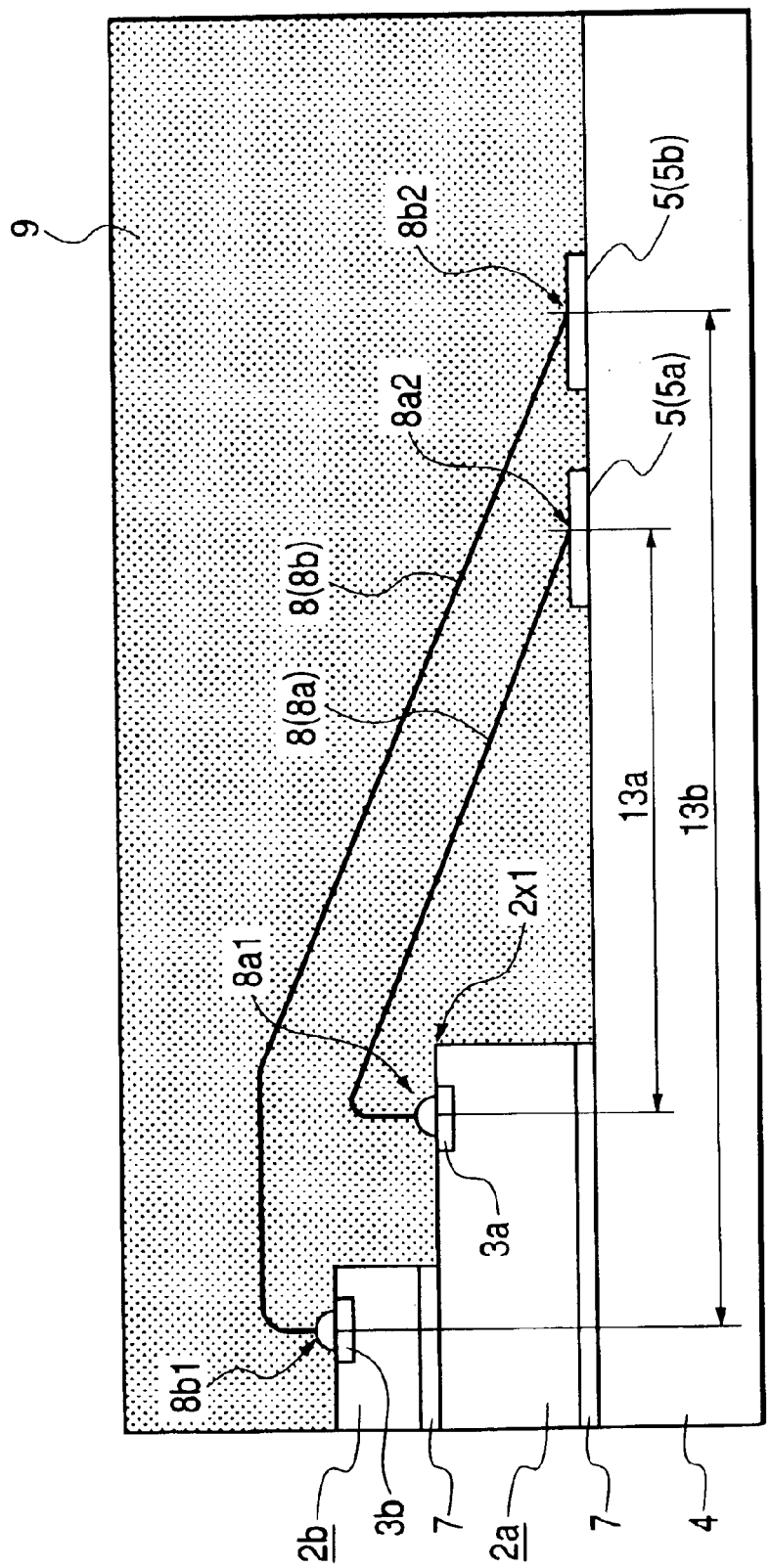

SEMICONDUCTOR DEVICE WITH ALTERNATE BONDING WIRE ARRANGEMENT

BACKGROUND OF THE INVENTION

The present invention relates to a semiconductor device and a production technology for the same and, specifically, to a semiconductor device having a face-up bonding structure and a technology which is effectively applied to a production technology for the same.

There is known a semiconductor device called "BGA (Ball Grid Array) type semiconductor device". This BGA type semiconductor device is packaged such that a semiconductor chip is mounted on a main surface of a wiring substrate called "interposer" and a plurality of ball-like solder bumps are arranged as external connection terminals on the rear surface opposite to the main surface of the wiring substrate.

BGA type semiconductor devices having different structures have been developed and commercialized. The structures of the BGA type semiconductor devices are roughly divided into a face-up bonding structure (wire bonding structure) and a face-down bonding structure. In the face-up bonding structure, electrode pads arranged on the main surface (circuit formation surface) of the semiconductor chip and electrode pads (connecting portions which are parts of wirings) arranged on the main surface of the interposer are electrically connected by bonding wires. In the face-down bonding structure, electrode pads arranged on the main surface of the semiconductor chip and electrode pads arranged on the main surface of the interposer are electrically connected by solder bumps interposed between the electrode pads.

The BGA type semiconductor device having a face-up bonding structure is disclosed by Japanese Unexamined Patent Publication No. 2001-144214, for example. The BGA type semiconductor device having a face-down bonding structure is disclosed by Japanese Unexamined Patent Publication No. Hei 6(1994)-34983, for example.

SUMMARY OF THE INVENTION

Along with a recent tendency toward the downsizing of electronic devices such as portable telephones and portable personal computers, demand for small-sized BGA type semiconductor devices to be incorporated into these electronic devices is growing. To cope with this demand, the inventors of the present invention has made studies into the downsizing of a BGA type semiconductor device having a face-up bonding structure which can be produced with existing production equipment at a low cost and has found the following problems.

To downsize the BGA type semiconductor device, the plane sizes of the semiconductor chip and the interposer must be reduced. To reduce the plane size of the semiconductor chip, the pitch of the electrode pads arranged on the main surface of the semiconductor chip must be reduced. To reduce the plane size of the interposer, the pitch of the electrode pads arranged on the main surface of the interposer must be reduced.

When the pitches of the electrode pads of the semiconductor chip and the interposer are reduced, the interval between adjacent bonding wires is also narrowed. When the interval between adjacent bonding wires is narrowed, a short circuit easily occurs between adjacent bonding wires due to "the flowing of the wires" that the bonding wires are deformed by a flow of a resin at the time of forming a resin sealing body by a transfer molding method. Therefore, in order to downsize the BGA type semiconductor device having a face-up bonding structure, a short circuit between adjacent bonding wires must be suppressed.

To suppress a short circuit between adjacent bonding wires, it is conceivable that the loop heights of adjacent bonding wires should be changed. This is effective in suppressing a short circuit between intermediate portions of bonding wires but it is difficult to suppress a short circuit on one end sides (electrode pad side of the semiconductor chip) of the bonding wires and the other end sides (the electrode pad side of the interposer substrate) of the bonding wires.

It is an object of the present invention to provide a technology capable of suppressing a short circuit between adjacent bonding wires.

It is another object of the present invention to provide a technology capable of downsizing a semiconductor device by suppressing a short circuit between adjacent bonding wires.

The above and other objects and new features of the present invention will become apparent from the following description and the accompanying drawings.

The present invention relates to the following.

(1) A semiconductor device comprises a semiconductor chip, a wiring substrate mounting the semiconductor chip on the main surface, a plurality of electrode pads arranged on the main surface of the semiconductor chip along one side of the semiconductor chip, a plurality of connecting portions arranged on the main surface of the wiring substrate along one side of the semiconductor chip, a plurality of wires for electrically connecting the plural electrode pads of the semiconductor chip to the plural connecting portions of the wiring substrate, respectively, and a resin sealing body for sealing the semiconductor chip and the plural wires, wherein the plural wires include first wires having one end portions connected to first electrode pads out of the plural electrode pads and the other end portions opposite to the one end portions and connected to first connecting portions out of the plural connecting portions and second wires having one end portions connected to second electrode pads adjacent to the first electrode pads out of the plural electrode pads and the other end portions opposite to the above one end portions and connected to second connecting portions adjacent to the first connecting portions, the loop height of the second wires being larger than the first wires, and wherein the one end portions of the second wires are connected at positions farther from one side of the semiconductor chip than the one end portions of the first wires and the other end portions of the second wires are connected at positions farther from one side of the semiconductor chip than the other end portions of the first wires.

(2) A process for producing a semiconductor device comprises:

an assembly parts preparing step of preparing a semiconductor chip having a plurality of electrode pads arranged on the main surface along one side of the main surface and a wiring substrate having a chip mounting area for mounting the semiconductor chip and a plurality of connecting portions arranged along one side of the semiconductor chip outside the chip mounting area;

a die bonding step of mounting the semiconductor chip on the chip mounting area of the wiring substrate;

a wire bonding step of electrically connecting the plural electrode pads of the semiconductor chip to the plural connecting portions of the wiring substrate by a plurality of wires, respectively; and a molding step of sealing the semiconductor chip and the plural wires with a resin, wherein the plural wires include first wires having one end portions connected to first electrode pads out of the plural electrode pads and the other end portions opposite to the one end portions and connected to first connecting portions out of the plural connecting portions and second wires having one end portions connected to second electrode pads adjacent to the first electrode pads out of the plural electrode pads and the other end portions opposite to the above one end portions and connected to second connecting portions adjacent to the first connecting portions out of the plural connecting portions, the loop height of the second wires being larger than the first wires, wherein the one end portions of the second wires are connected at positions farther from one side of the semiconductor chip than the one end portions of the first wires, and wherein the other end portions of the second wires are connected at positions farther from one side of the semiconductor chip than the other end portions of the first wires.

BRIEF DESCRIPTION OF THE DRAWINGS

FIGS. 4(A) to 4(C) are diagrams showing the internal structure of the semiconductor device of Embodiment 1, in which FIG. 4(A) is a sectional view along line B—B of FIG. 3, FIG. 4(B) is a sectional view along line C—C of FIG. 3, and FIG. 4 (C) is a sectional view obtained by combining FIG. 4(A) with FIG. 4(B);

FIG. 5 is a partially enlarged plan view of FIG. 3;

FIG. 25 is a sectional view of the key section corresponding to FIG. 24.

DETAILED DESCRIPTION OF THE PREFERRED EMBODIMENTS

Preferred embodiments of the present invention will be described in detail with reference to the accompanying drawings. In all the drawings for explaining the embodiments of the present invention, elements denoted by the same symbol have the same function and a repeated description of the elements is omitted.

(Embodiment 1)

In Embodiment 1, a BGA type semiconductor device having a face-up bonding structure to which the present invention is applied will be described hereinbelow.

Figure 1:
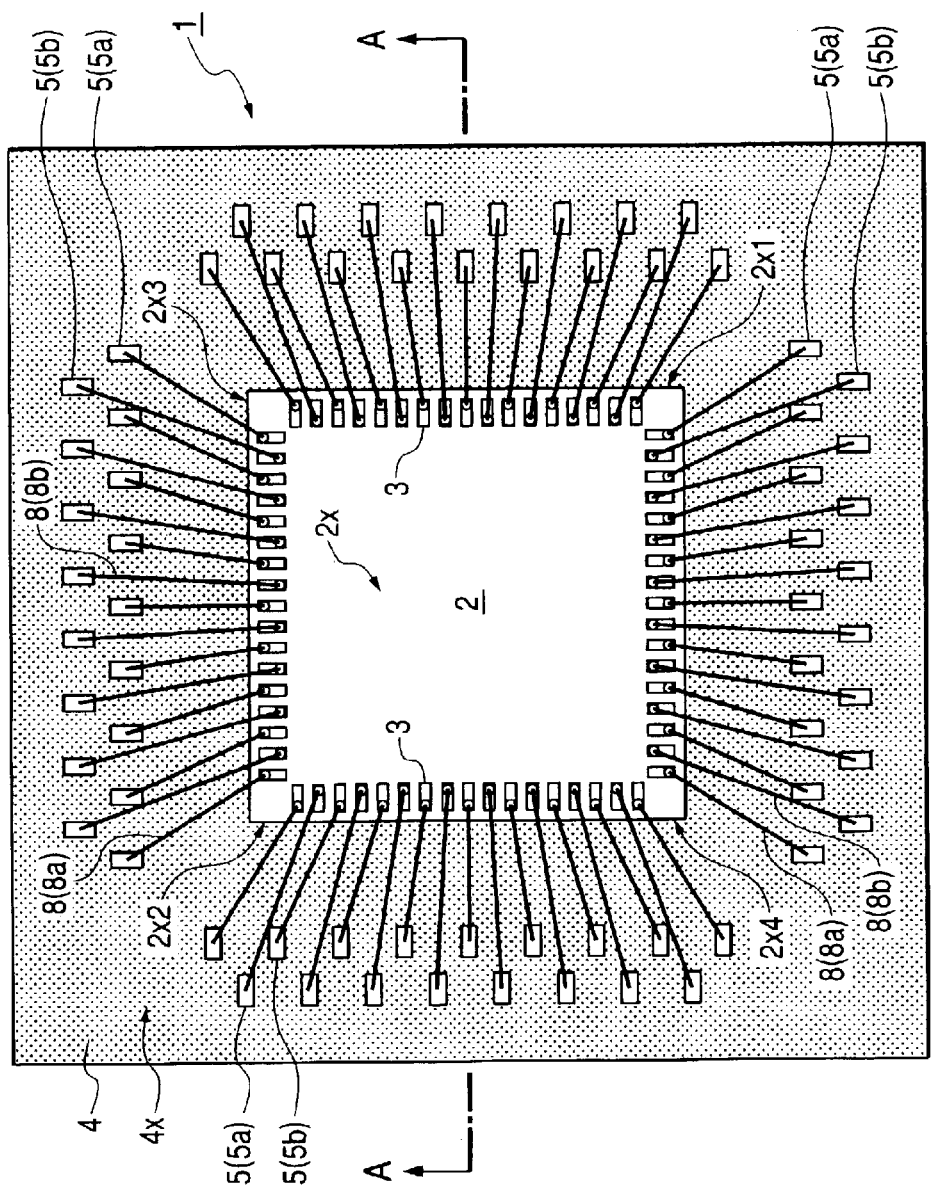
FIG. 1 is a plan view showing the internal structure of a semiconductor device according to Embodiment 1 of the present invention.
Figure 2:
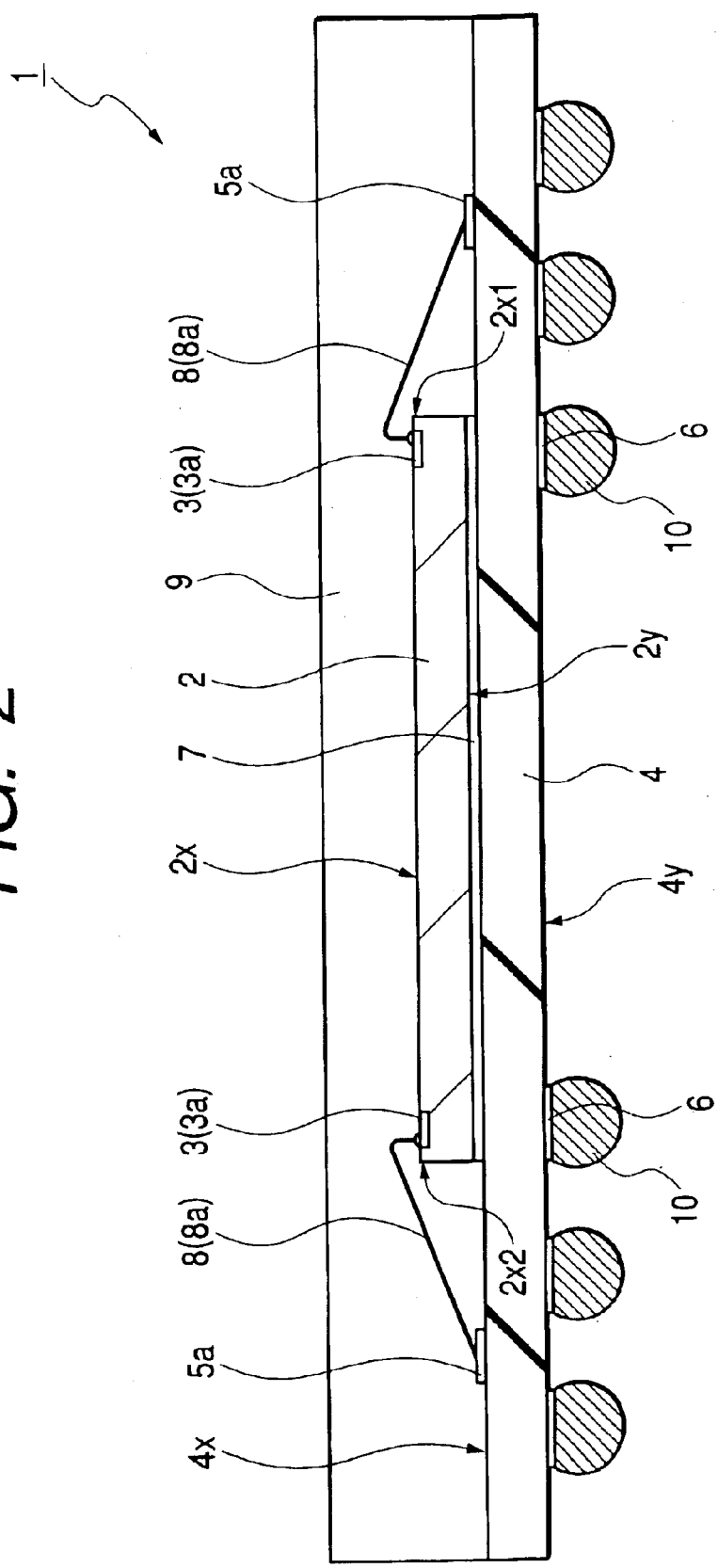
FIG. 2 is a sectional view along line A—A of FIG. 1.
Figure 3:
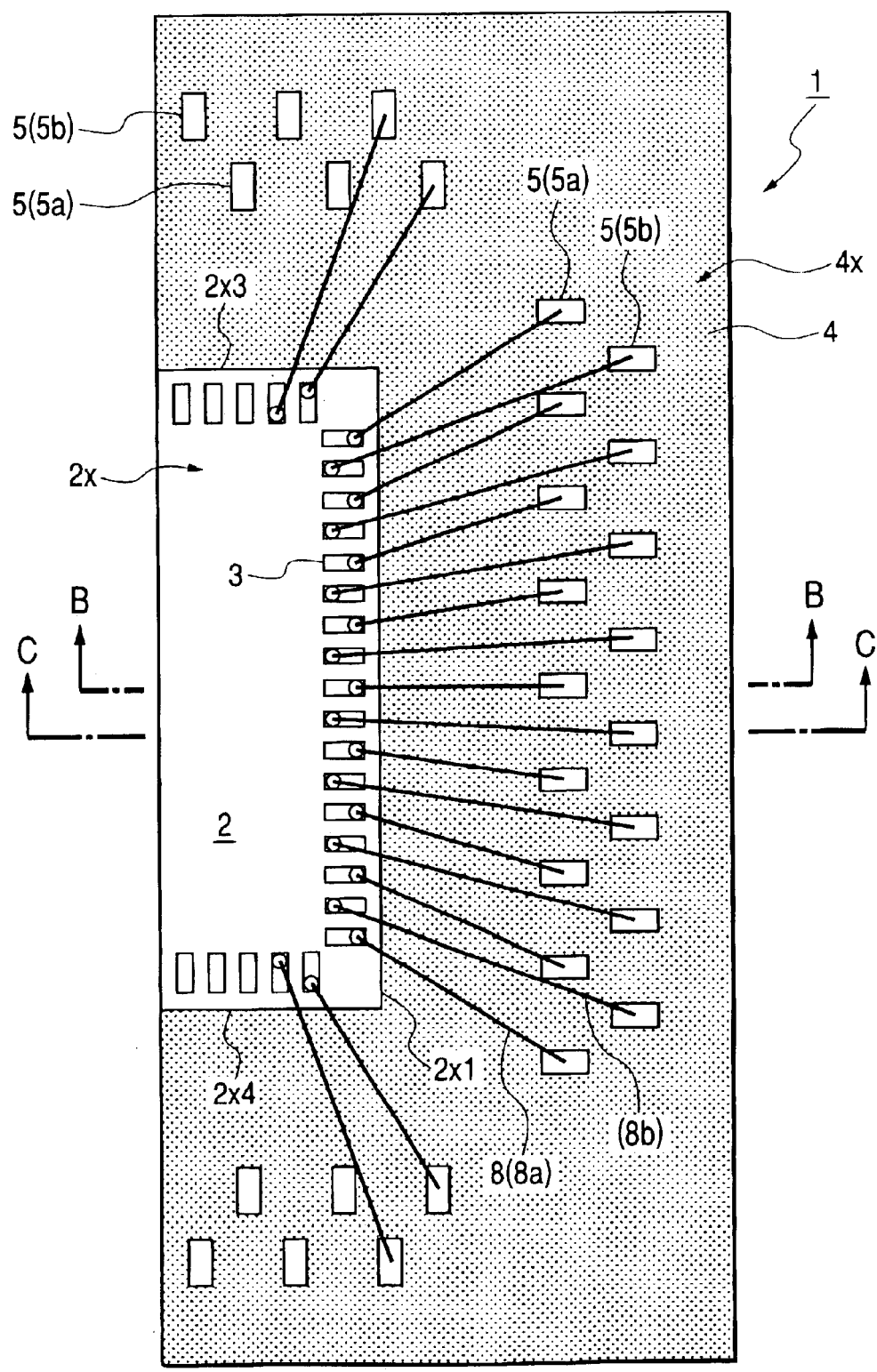
FIG. 3 is a partially enlarged plan view of FIG. 1.
Figure 4A:
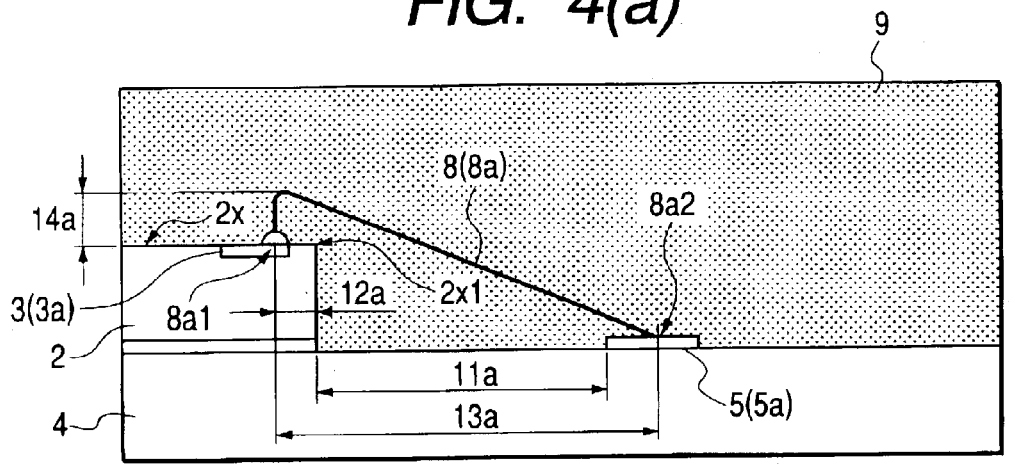
Figure 4B:
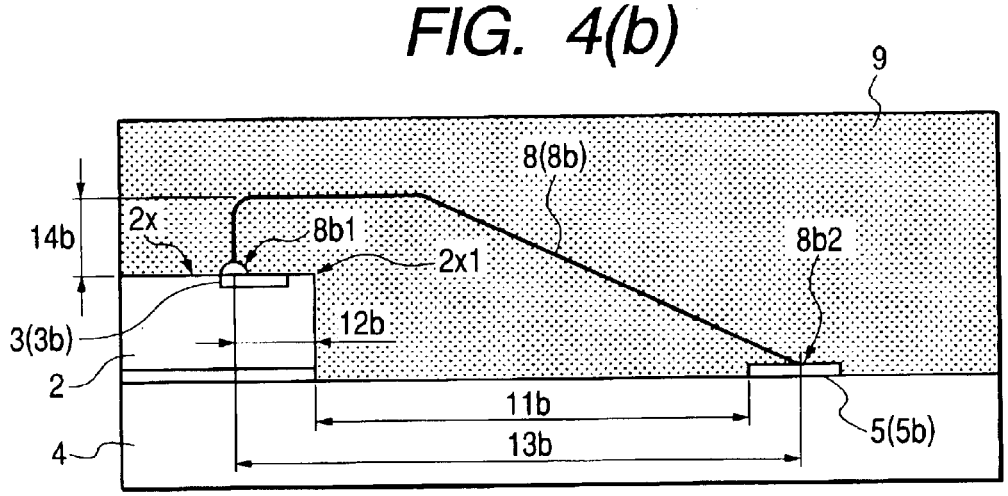
Figure 4C:
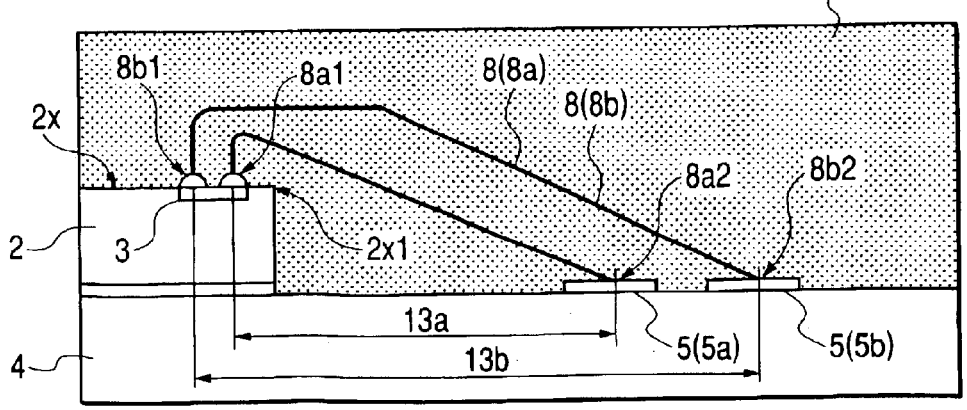

FIG. 1 is a plan view showing the internal structure of a BGA type semiconductor device having a face-up bonding structure according to Embodiment 1 of the present invention, FIG. 2 is a sectional view along line A—A of FIG. 1, FIG. 3 is a partially enlarged plan view of FIG. 1, FIGS. 4(A) to 4(C) are diagrams showing the internal structure of the semiconductor device according to Embodiment 1 (FIG. 4(A) is a sectional view along line B—B of FIG. 3, FIG. 4(B) is a sectional view along line C—C of FIG. 3 and FIG. 4(C) is a sectional view obtained by combining FIG. 4(A) with FIG. 4(B)), and FIG. 5 is a partially enlarged view of FIG. 3.

As shown in FIG. 1 and FIG. 2, the BGA type semiconductor device 1 according to Embodiment 1 has a package structure that a semiconductor chip 2 is mounted on the main surface 4x out of the main surface 4x and the rear surface 4y located on the opposite sides of an interposer 4 (opposite main surface 4x and rear surface 4y) and a plurality of ball-like solder bumps 10 are arranged as external connection terminals on the rear surface 4y of the interposer 4.

The semiconductor chip 2 has a square plane which is perpendicular to its thickness direction, for example, a 5.0 mm×5.0 mm plane in this embodiment. The semiconductor chip 2 is mainly composed of a semiconductor substrate, a plurality of transistor elements formed on the main surface of the semiconductor substrate, a multi-layered wiring laminate consisting of a plurality of insulating layers and a plurality of wiring layers formed on the main surface of the semiconductor substrate, and a surface protective film (final protective film) formed on the multi-layered wiring laminate, though it is not limited to this structure. The insulating layers are each formed of a silicon oxide film, for example. The wiring layers are each formed of a metal film such as an aluminum (Al), aluminum alloy, copper (Cu) or copper alloy film. The surface protective film is formed of a multi-layer laminate film consisting of an inorganic insulating film such as silicon oxide film or silicon nitride film and an organic insulating film.

The semiconductor chip 2 has a main surface (circuit formation surface) 2x and a rear surface 2y which are located on opposite sides, and an integrated circuit, for example, a control circuit is formed on thee main surface 2x of the semiconductor chip 2. This control circuit is mainly composed of transistor elements formed on the main surface of the semiconductor substrate and wirings formed on the multi-layered wiring laminate. The semiconductor chip 2 is fixed to the main surface 4x of the interposer 4 by an adhesive 7 interposed between the rear surface 2y thereof and the main surface 4x of the interposer 4.

Four groups of electrode pads 3 are arranged on the main surface of the semiconductor chip 2. The electrode pads 3 of a first group are arranged along the first side 2x1 of the semiconductor chip 2, the electrode pads 3 of a second group are arranged along the second side 2x2 of the semiconductor chip 2, the electrode pads 3 of a third group are arranged along the third side 2x3 of the semiconductor chip 3, and the electrode pads 3 of a fourth group are arranged along the fourth side 2x4 of the semiconductor chip 2. The electrode pads 3 of all the groups are formed on the uppermost wiring layer out of the multi-layered wiring laminate of the semiconductor chip 2 and exposed from bonding openings formed in the surface protective film of the semiconductor chip 2 corresponding to the respective electrode pads 3.

The interposer 4 has a square plane which is perpendicular to its thickness direction, for example, a 13.0 mm×13.0 mm plane in this embodiment. The interposer 4 is mainly composed of a core material, a protective film formed to cover the main surface of the core material and a protective film formed to cover the rear surface (surface opposite to the main surface of the core material) opposite to the main surface of the core material, though it is not limited to this structure. The core material has a multi-layered wiring structure comprising wirings in the main surface, rear surface and interior thereof. Each insulating layer of the core material is formed of a highly elastic resin substrate made from glass fibers impregnated with an epoxy-based or polyimide-based resin. Each wiring layer of the core material is formed of a metal film essentially composed of Cu, for example. The protective film on the main surface of the core material is formed to protect mainly wirings formed in the uppermost wiring layer of the core material and the protective film on the rear surface of the core material is formed to protect mainly wirings formed in the lowermost wiring layer of the core material. As the protective films on the main surface and the rear surface of the core material are used an insulating film made from a two-liquid alkali developing solder resist ink or thermosetting one-liquid solder resist ink.

Four groups of electrode pads 5 (wire connecting portions) are arranged around the semiconductor chip 2 on the main surface 4x of the interposer 4. The electrode pads 5 of a first group are arranged along the first side 2x1 of the semiconductor chip 2, the electrode pads 5 of a second group are arranged along the second side 2x2 of the semiconductor chip 2, the electrode pads 5 of a third group are arranged along the third side 2x3 of the semiconductor chip 2, and the electrode pads 5 of a fourth group are arranged along the fourth side 2x4 of the semiconductor chip 2. The electrode pads 5 of all the groups are formed with parts of the plural wirings formed in the uppermost wiring layer of the core material and exposed from openings formed in the protective film on the main surface of the core material corresponding to the respective electrode pads 5.

A plurality of electrode pads 6 are formed on the rear surface 4y of the interposer 4. The plural electrode pads 6 are formed with part of the plural wirings formed in the lowermost wiring layer of the core material and exposed from openings formed in the protective film on the rear surface of the core material corresponding to the respective electrode pads 6.

The electrode pads 3 of the first group of the semiconductor chip 2 and the electrode pads 5 of the first group of the interposer 4 are electrically connected to each other by bonding wires 8 of a first group, respectively. The electrode pads 3 of the second group of the semiconductor chip 2 and the electrode pads 5 of the second group of the interposer 4 are electrically connected to each other by bonding wires 8 of a second group, respectively. The electrode pads 3 of the third group of the semiconductor chip 2 and the electrode pads 5 of the third group of the interposer 4 are electrically connected to each other by bonding wires 8 of a third group, respectively. The electrode pads 3 of the fourth group of the semiconductor chip 2 and the electrode pads 5 of the fourth group of the interposer 4 are electrically connected to each other by bonding wires 8 of a fourth group, respectively. The bonding wires 8 are gold (Au) wires, for example. The bonding wires 8 are connected by a nail head bonding (ball bonding) method making use of ultrasonic vibration for thermal contact bonding.

The bonding wires 8 of all the groups are connected by the nail head bonding method in which the electrode pads 3 of the semiconductor chip 2 are used as first bonding points and the electrode pads 5 of the interposer 4 are used as second bonding points.

The semiconductor chip 2 and the plural bonding wires 8 of all the groups are sealed up with a resin sealing body 9 formed on the main surface 4x of the interposer 4. The resin sealing body 9 is formed from an epoxy-based thermosetting insulating resin containing a phenolic curing agent, silicone rubber and a large number of fillers (such as silica) to reduce stress. A transfer molding method which is suitable for mass-production is used to form the resin sealing body 9.

The plural solder bumps 10 are fixed and electrically and mechanically connected to the respective electrode pads 6 formed on the rear surface 4y of the interposer 4. The solder bumps 10 are Pb-free solder bumps which contain substantially no Pb, for example, Sn-1[wt %]Ag-0.5[wt %]Cu solder bumps.

The electrode pads of the first group of the semiconductor chip 2 have a rectangular plane form that their two long opposite sides extend in a direction away from the first side 2x1 of the semiconductor chip 2 and their two short opposite sides extend along the first side 2x1 of the semiconductor chip 2. The electrode pads 3 of the second group, the electrode pads 3 of the third group and the electrode pads 3 of the fourth group of the semiconductor chip 2 have a rectangular plane form that their two long opposite sides extend in a direction away from the respective sides (second side 2x2, third side 2x3, fourth side 2x4) of the semiconductor chip 2 and their two short opposite sides extend along the respective sides (second side 2x2, third side 2x3, fourth side 2x4) of the semiconductor chip 2.

The bonding wires 8 of the first group include first bonding wires 8a having one end portions 8a1 connected to the first electrode pads 3a out of the electrode pads 3 of the first group of the semiconductor chip 2 and the other end portions 8a2 opposite to the one end portions 8a1 and connected to the first electrode pads 5a out of the electrode pads 5 of the first group of the interposer 4 as shown in FIG. 3 and FIG. 4 (A) and second bonding wires 8b having one end portions 8b1 connected to the second electrode pads 3b adjacent to the first electrode pads 3a out of the electrode pads 3 of the first group of the semiconductor chip 2 and the other end portions 8b2 opposite to the one end portions 8b1 and connected to the second electrode pads 5b adjacent to the first electrode pads 5a out of the electrode pads 5 of the first group of the interposer 4 as shown in FIG. 3 and FIG. 4(B). The loop height 14a (see FIG. 4(A)) of the first bonding wires 8a is lower than the loop height 14b of the second bonding wires 8b.

As shown in FIG. 4(A) and FIG. 4(B), the one end portion 8b1 of the second bonding wire 8b is connected at a position farther from the first side 2x1 of the semiconductor chip than the one end portion 8a1 of the first bonding wire 8a, and the other end portion 8b2 of the second bonding wire 8b is connected at a position farther from the first side 2x1 of the semiconductor chip 2 than the other end portion 8a2 of the first bonding wire 8a.

Due to this constitution, as shown in FIG. 4(C), there is no overlapped portion between the first bonding wire 8a and the second bonding wire 8b in the arrangement direction of the bonding wires 8, thereby making it possible to suppress a short circuit between adjacent bonding wires even if the bonding wires 8 are deformed by a flow of the resin when the resin sealing body is to be formed by the transfer molding method.

A short circuit between adjacent bonding wires can be suppressed by changing the loop height of one of them. However, as an overlapped portion between the bonding wires in the arrangement direction of the bonding wires is formed on one end sides and the other end sides of the bonding wires in this case, a short circuit between the intermediate portions of the bonding wires can be suppressed but it is difficult to suppress a short circuit on one end sides and the other end sides. In contrast to this, as there is no overlapped portion between the bonding wires in the arrangement direction of the bonding wires on one end sides and the other end sides thereof in this embodiment, a short circuit on one end sides and the other end sides of the bonding wires can be suppressed.

For the downsizing of the BGA type semiconductor device 1, the plane sizes of the semiconductor chip and the interposer must be reduced. To reduce the plane sizes of the semiconductor chip and the interposer, the pitches of the electrode pads arranged on the main surfaces of the semiconductor chip and the interposer must be reduced. When the pitch of the electrode pads on the semiconductor chip is reduced, a bonding wire having a small diameter must be used. Since the bonding wire having a small diameter has low mechanical strength, it is easily deformed on one end side and the other end side thereof. When the pitches of the electrode pads of the semiconductor chip and the interposer are reduced, the interval between adjacent bonding wires is narrowed, whereby a short circuit easily occurs on one end sides and the other end sides of the bonding wires. Therefore, to downsize the BGA type semiconductor device 1, a short circuit on one side ends and the other side ends of the bonding wires must be suppressed. Since a short circuit can be suppressed on one end sides and the other end sides of the bonding wires in this embodiment, the BGA type semiconductor device 1 can be downsized.

The electrode pads 3 of the first group of the semiconductor chip 2 consist of the first electrode pads 3a and the second electrode pads 3b arranged alternately and parallel to each other linearly as shown in FIG. 3, and the electrode pads 5 of the first group of the interposer 4 consist of the first electrode pads 5a and the second electrode pads 5b arranged in a zigzag manner as shown in FIG. 3.

As shown in FIG. 4(A) and FIG. 4(B), the distance 11b between the first side 2x1 of the semiconductor chip 2 and the second electrode pad 5b is larger than the distance 11a between the first side 2x1 of the semiconductor chip 2 and the first electrode pad 5a, the distance 12b between the first side 2x1 of the semiconductor chip 2 and the one end portion 8b1 of the second bonding wire 8b is larger than the distance 12a between the first side 2x1 of the semiconductor chip 2 and the one end portion 8a1 of the first bonding wire 8a, and the distance 13b between the one end portion 8b1 and the other end portion 8b2 of the second bonding wire 8b is larger than the distance 13a between the one end portion 8a1 and the other end portion 8a2 of the first bonding wire 8a.

As shown in FIG. 5, the width 3w of the electrode pads 3 of the first group of the semiconductor chip 2 is smaller than the width 5w of the electrode pads 5 of the first group of the interposer 4, and the pitch 3p of the electrode pads 3 of the first group of the semiconductor chip 2 is smaller than the pitch 5p of the electrode pads 3 of the first group of the interposer 4. In this embodiment, the width 3w of the electrode pads 3 is, for example, about 60 μm, the pitch 3p of the electrode pads 3 is, for example, about 65 μm, the width 5w of the electrode pads 5 is, for example, about 100 μm, and the pitch 5p of the electrode pads 5 is, for example, about 200 μm. The pads 3 of the first group of the semiconductor chip 2 have the contact mark 26 of a probe needle on the bonding surface connected to the bonding wires 8, and the contact mark 26 is farther from the first side 2x1 of the semiconductor chip 2 than the one end portion 8a1 of the first bonding wire 8a and closer to the first side 2x1 of the semiconductor chip than the one end portion 8b1 of the second bonding wire 8b.

The second to fourth groups of wires have the same constitution as the first group of wires, the second to fourth groups of pads of the semiconductor chip 2 have the same constitution as the first group of pads of the semiconductor chip, and the second to fourth groups of pads of the interposer 4 have the same constitution as the first group of pads of the interposer 4.

The plane sizes of the resin sealing body 9 and the interposer 4 are almost the same, and the side surfaces of the resin sealing body 9 are flush with the side surfaces of the interposer 4. In the production of the BGA type semiconductor device 1 of this embodiment, a batch molding system is employed. Therefore, the BGA type semiconductor device 1 which will be described hereinafter is produced by sealing up semiconductor chips arranged in the respective device areas of a multiple panel (multi-chip substrate) having a plurality of device areas (product forming areas) on the main surface with a single resin sealing body (batch resin sealing body) in a lump and separating the plural device areas of the multiple panel from one another together with this resin sealing body.

Figure 6:
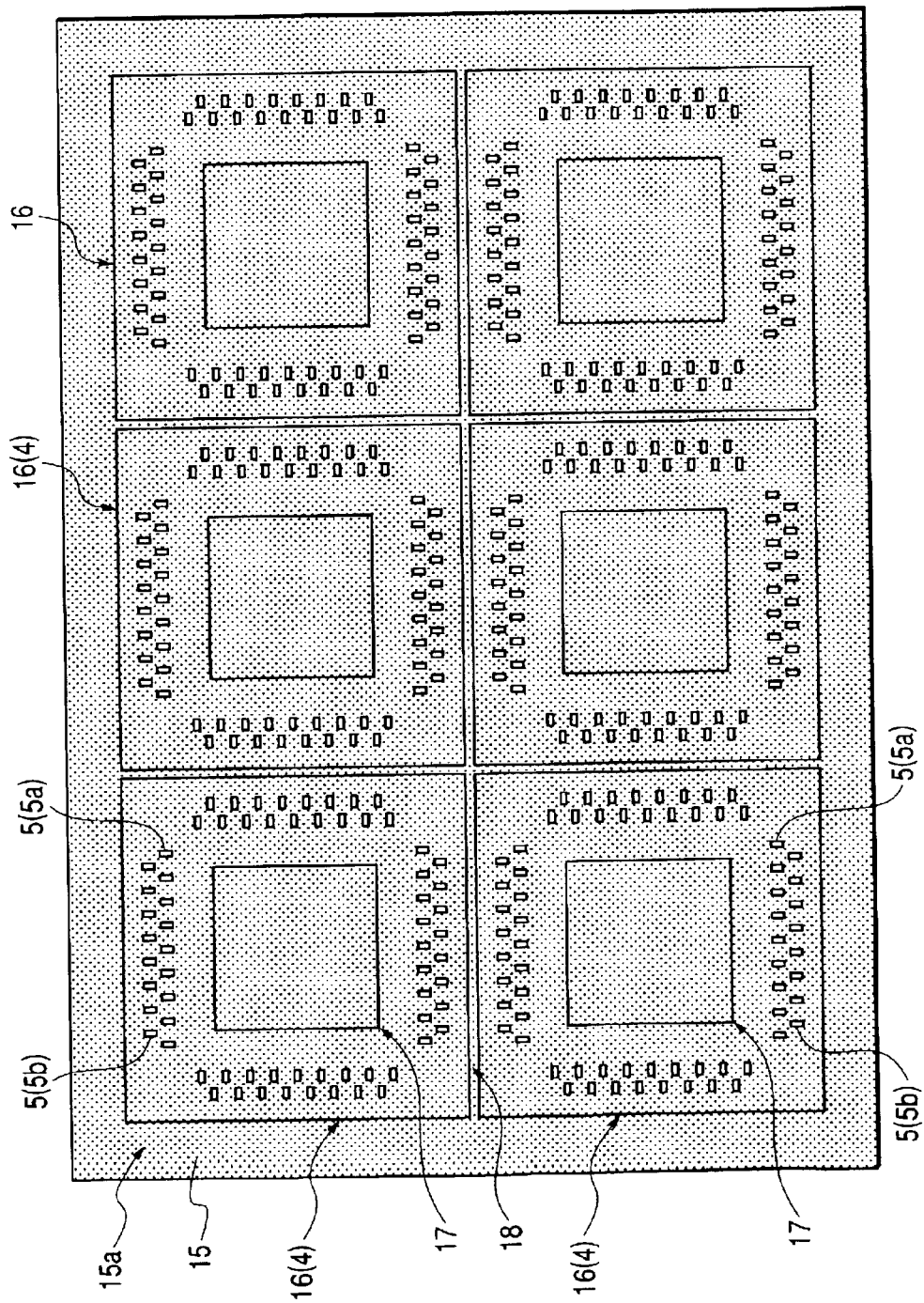
FIG. 6 is a plan view showing the schematic constitution of a multiple panel used for the production of the semiconductor device of Embodiment 1.

FIG. 6 is a plan view showing the schematic constitution of the multiple panel used for the production of the BGA type semiconductor device 1.

As shown in FIG. 6, the multiple panel 15 has a square plane form which is perpendicular to its thickness direction, for example, a rectangular plane in this embodiment. A molding area (not shown) is formed in the main surface (chip mounting surface) of the multiple panel 15, a plurality of device areas 16 are formed in this molding area, and a chip mounting area 17 is formed in each of the device areas 16. The semiconductor chip 2 is mounted in each chip mounting area 17, and the resin sealing body for sealing up the plural semiconductor chips 2 mounted in the respective chip mounting areas 17 in a lump is formed in the molding area.

The device areas 16 are defined by dividing areas 18 for specifying the boundaries thereof. The structure and plane form of the device areas 16 are the same as those of the interposer 4 shown in FIG. 1 and FIG. 2.

The production of the BGA type semiconductor device 1 will be described with reference to FIG. 7 to FIG. 15.

Figure 7:
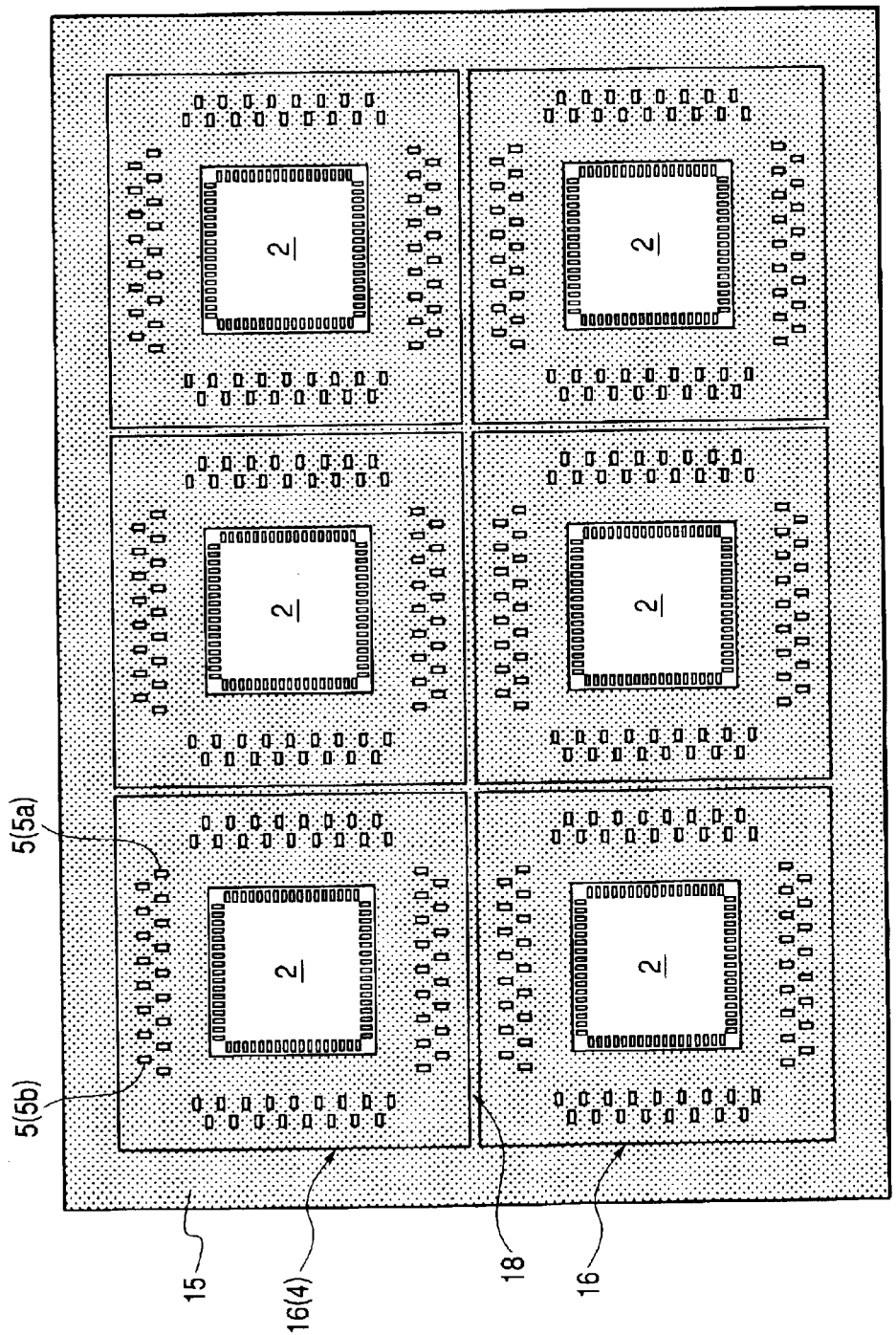
FIG. 7 is a plan view showing that a chip bonding step is carried out in the production of the semiconductor device of Embodiment 1.
Figure 8:
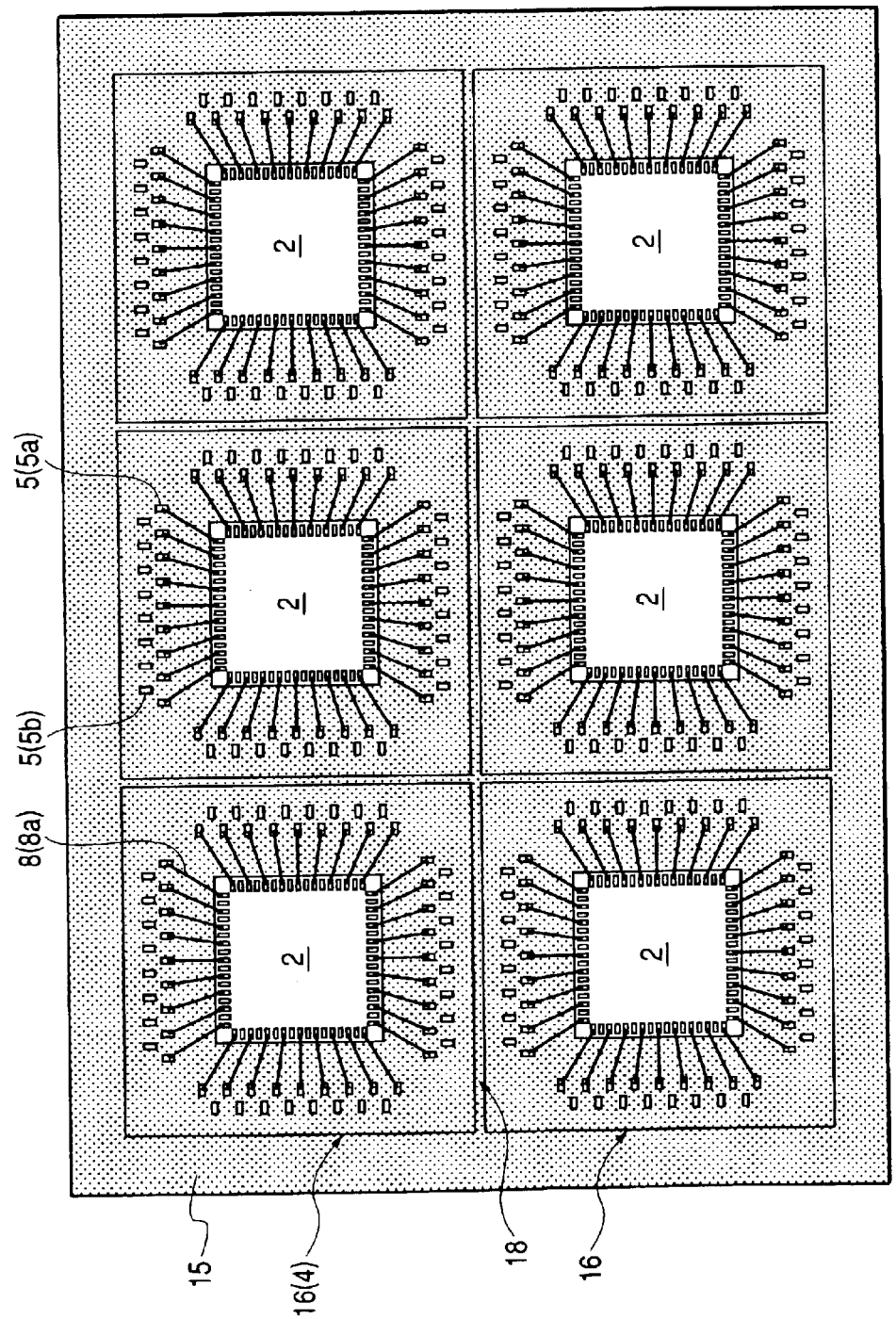
FIG. 8 is a plan view showing that a first wire bonding step is carried out in the production of the semiconductor device of Embodiment 1.
Figure 9:
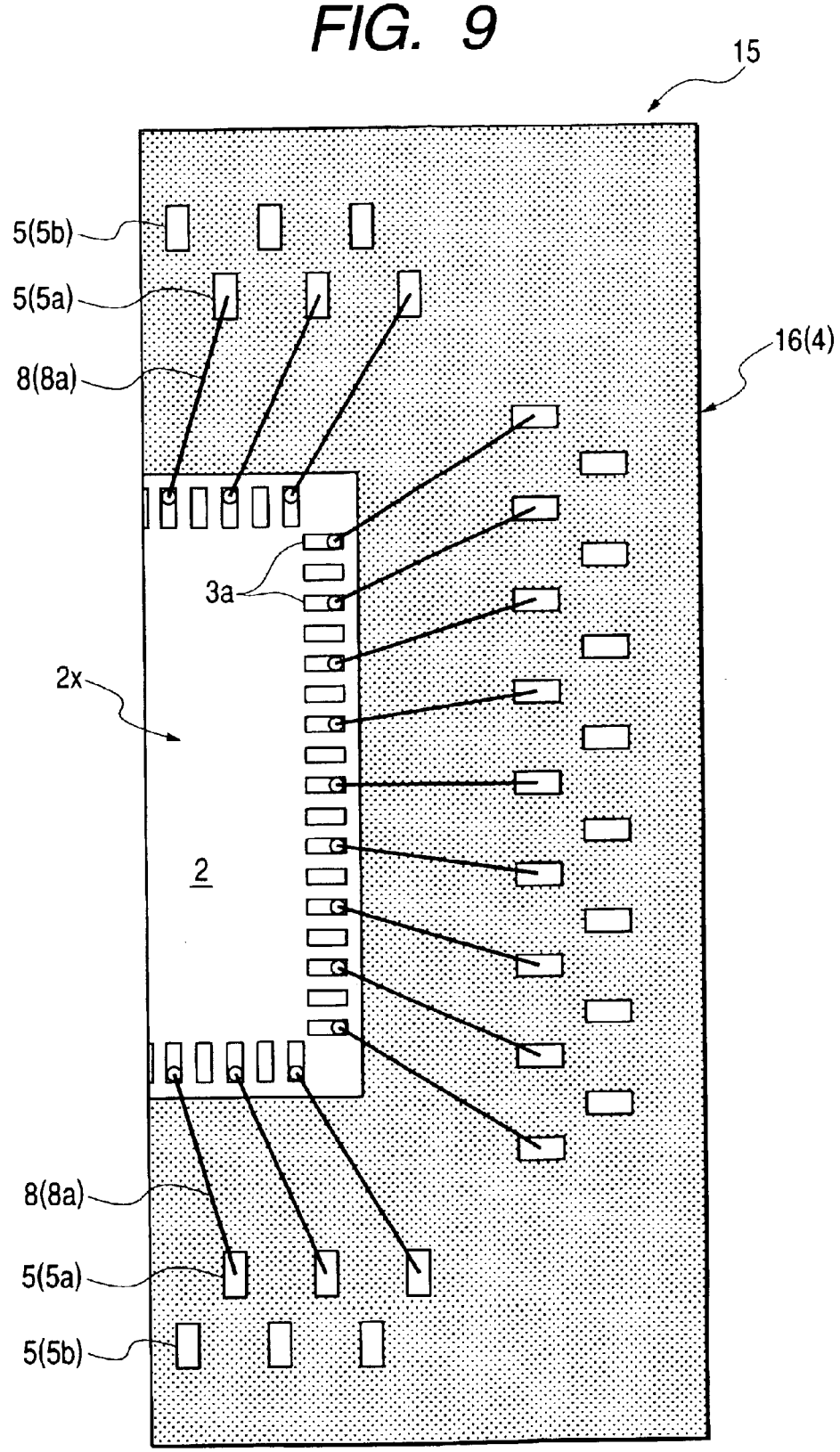
FIG. 9 is a partially enlarged plan view of FIG. 8.
Figure 10:
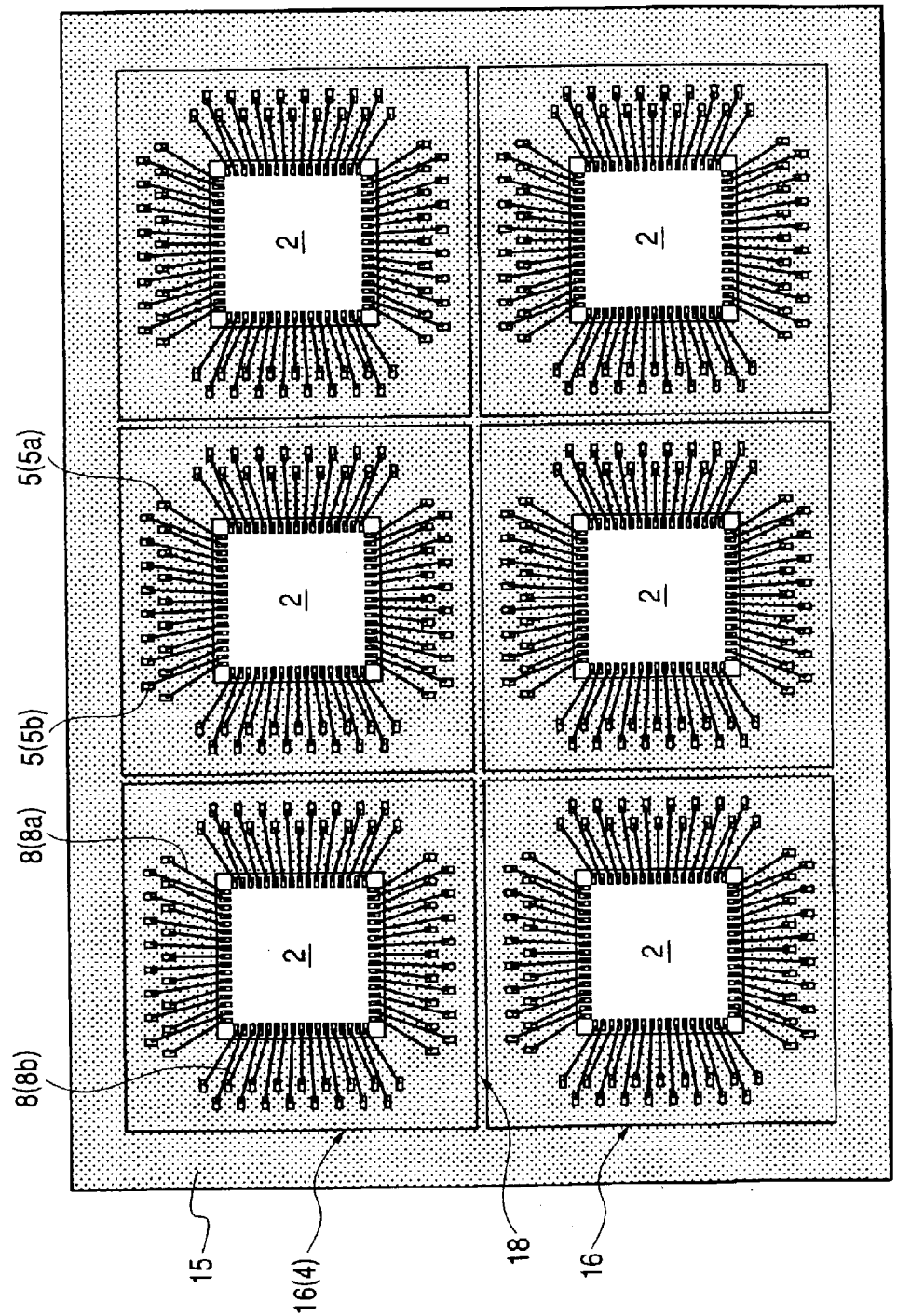
FIG. 10 is a plan view showing that a second wire bonding step is carried out in the production of the semiconductor device of Embodiment 1.
Figure 11:
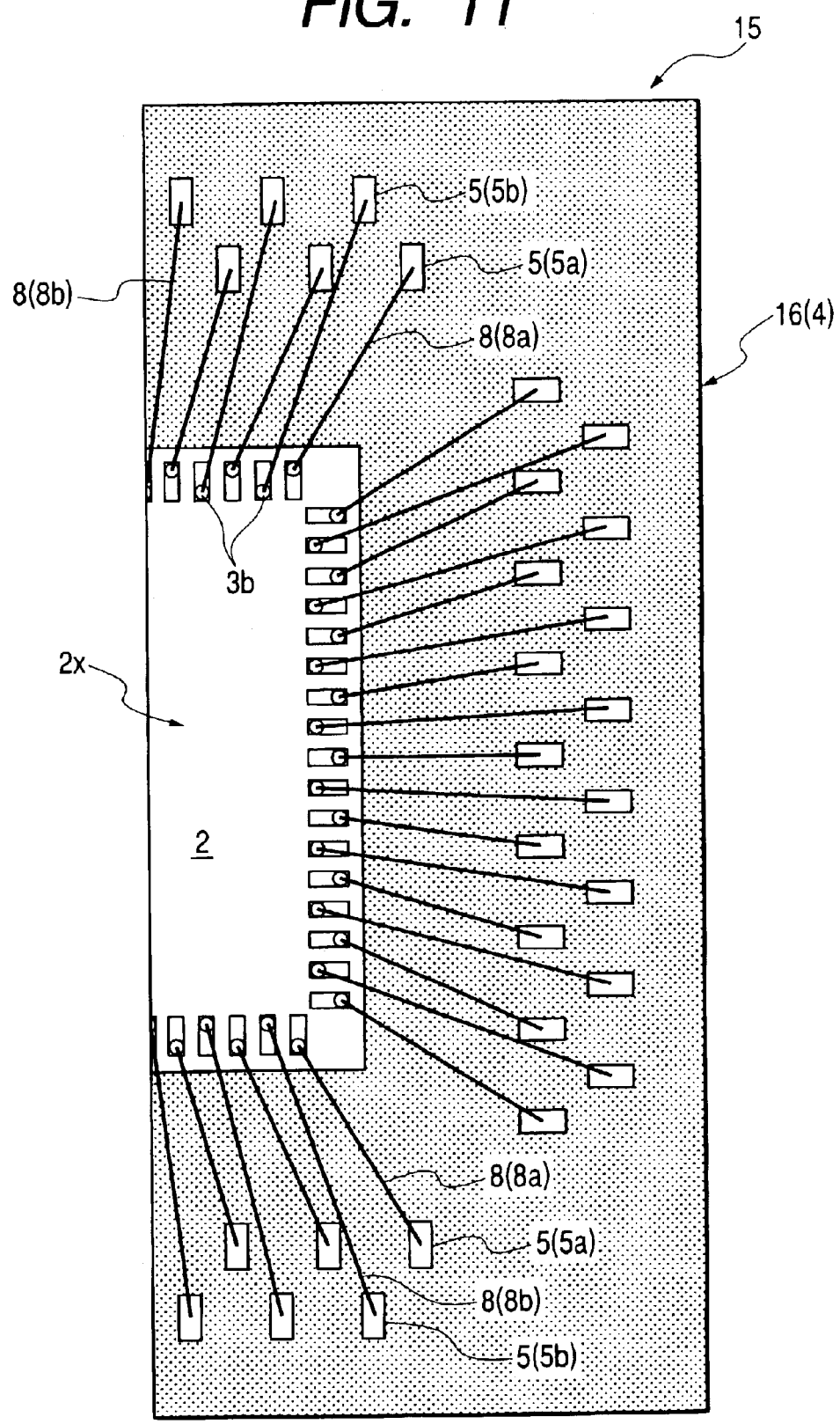
FIG. 11 is a partially enlarged plan view of FIG. 10.
Figure 12:
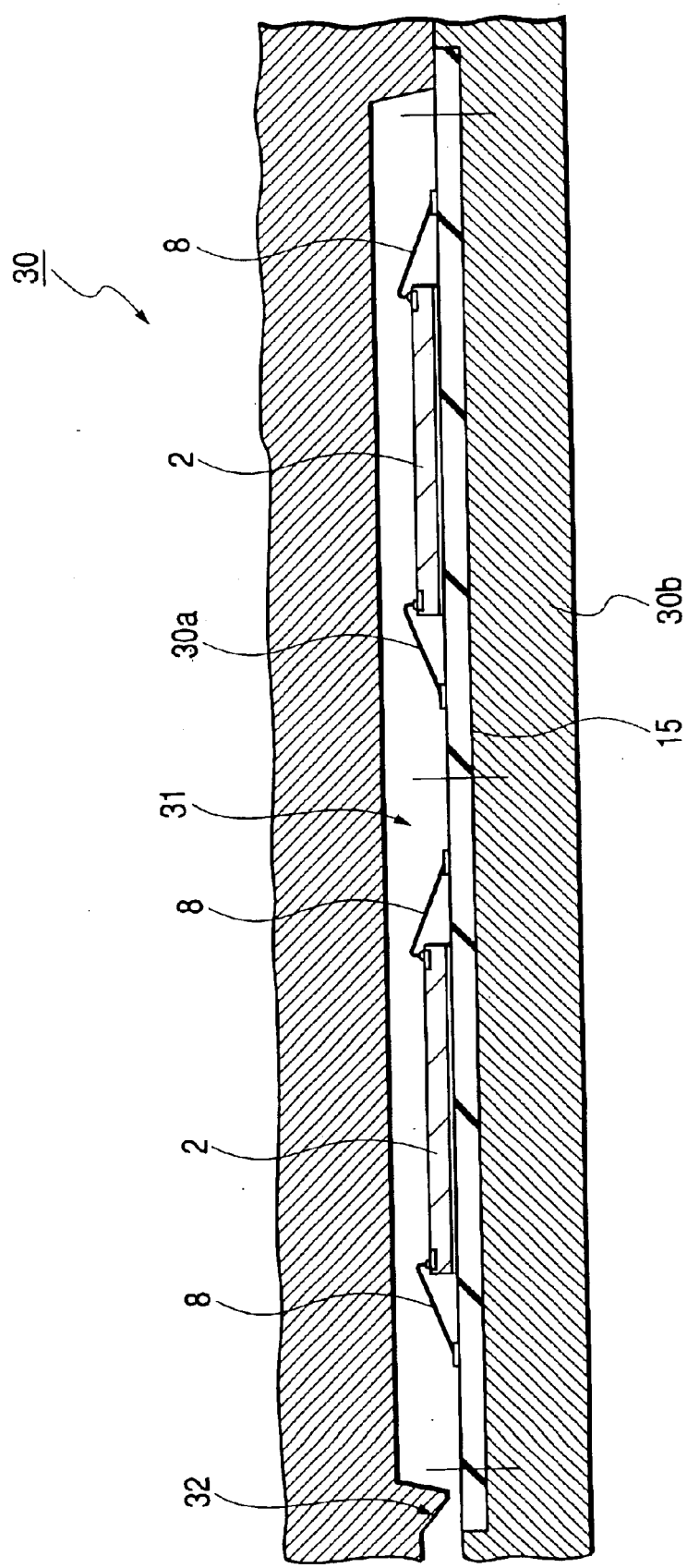
FIG. 12 is a sectional view showing that a multiple panel is positioned in a mold in the molding step of the production of the semiconductor device of Embodiment 1.
Figure 13:
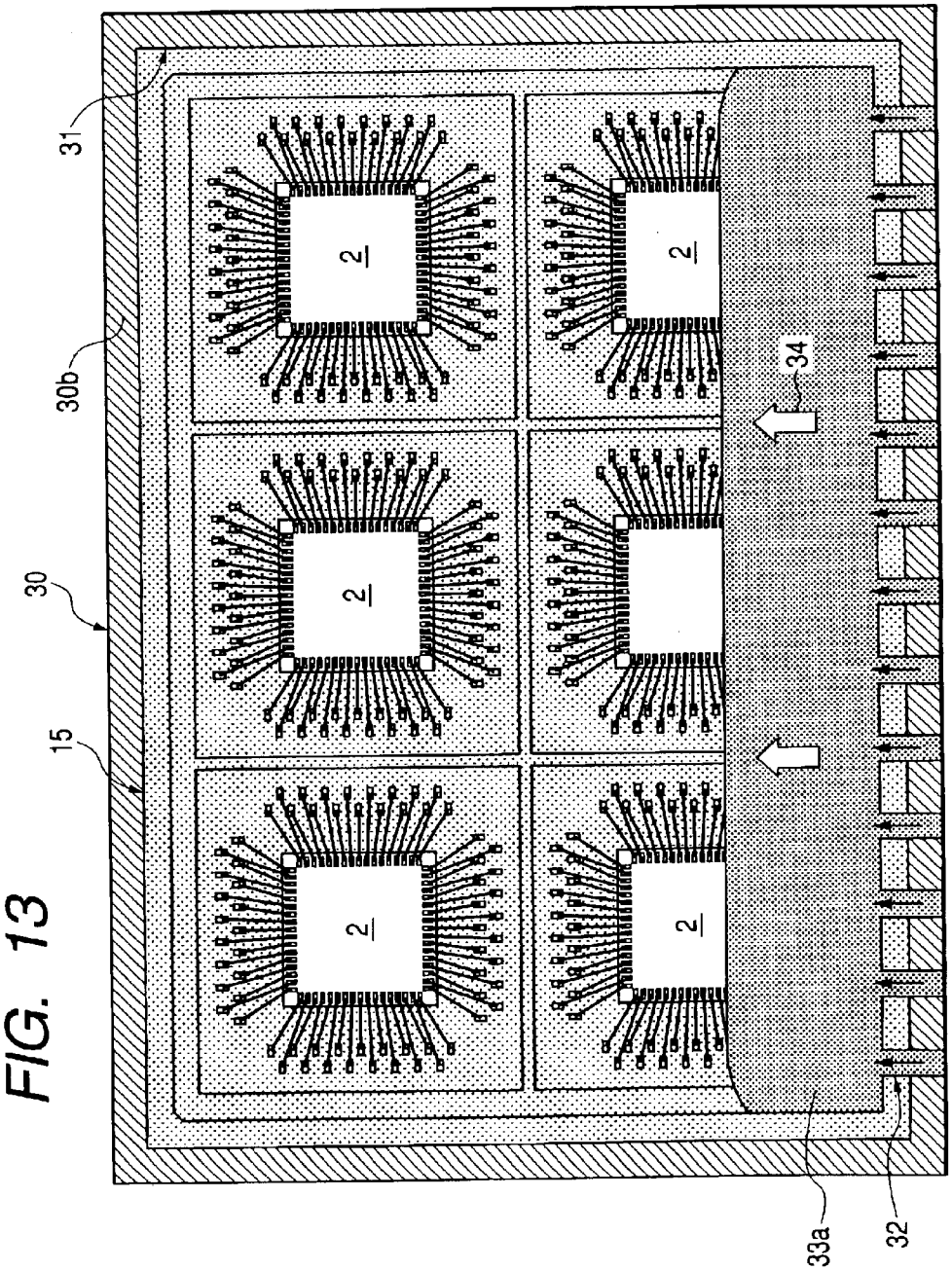
FIG. 13 is a plan view showing that a resin flows in the cavity of the mold in the molding step of the production of the semiconductor device of Embodiment 1.
Figure 14:
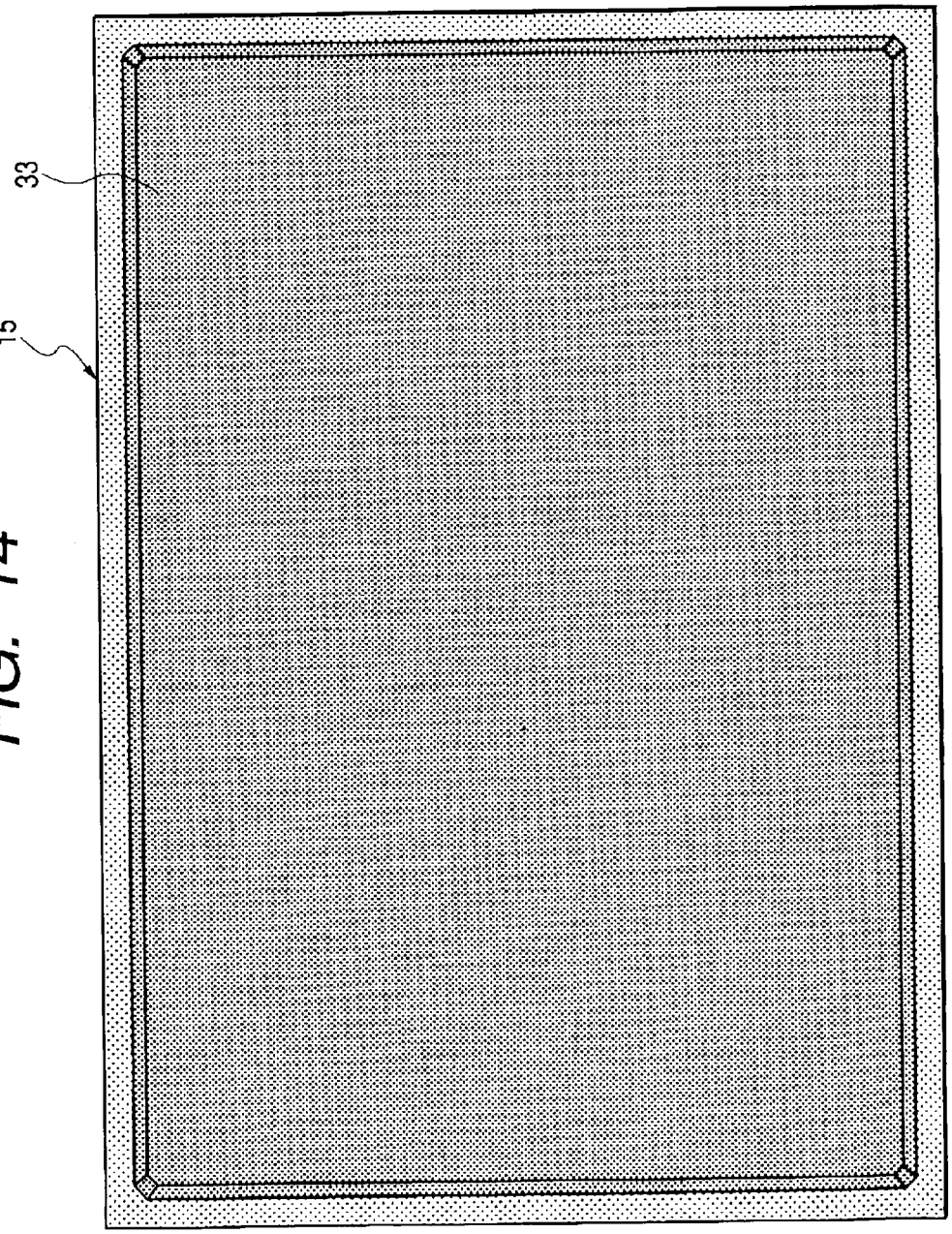
FIG. 14 is a plan view showing that the molding step is carried out in the production of the semiconductor device of Embodiment 1.
Figure 15:
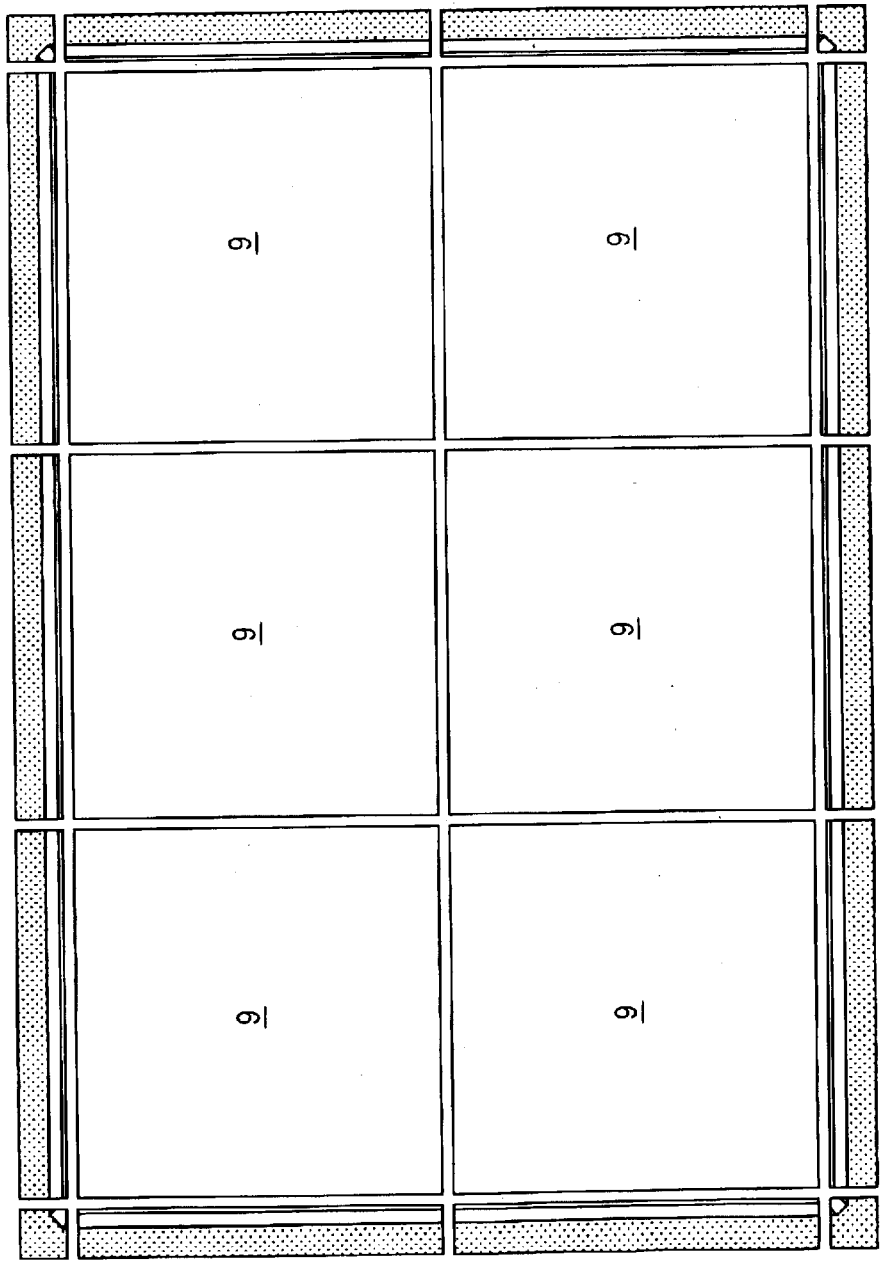
FIG. 15 is a plan view showing that a cutting step is carried out in the production of the semiconductor device of Embodiment 1.

FIG. 7 is a plan view showing that a die bonding step is carried out, FIG. 8 is a plan view showing that a first wire bonding step is carried out, FIG. 9 is a partially enlarged plan view of FIG. 8, FIG. 10 is a plan view showing that a second wire bonding step is carried out, FIG. 11 is a partially enlarged plan view of FIG. 10, FIG. 12 is a sectional view showing that a multiple panel is positioned in a mold in the molding step, FIG. 13 is a plan view showing that a resin flows in the inside of the cavity of the mold in the molding step, FIG. 14 is a plan view after the molding step is carried out, and FIG. 15 is a plan view showing that a cutting step is carried out.

The semiconductor chips 2 and the multiple panel 15 are first prepared.

Next, an adhesive 7 such as an epoxy-based thermosetting resin is applied to the main surface of the multiple panel 15, the semiconductor chip 2 is mounted on each chip mounting area 17 by the adhesive 7, and then the adhesive 7 is cured thermally to fix the semiconductor chip 2 in each chip mounting area 17 as shown in FIG. 7.

As shown in FIG. 8 and FIG. 9, the plural first electrode pads 3a of the semiconductor chip 2 are electrically connected to the plural first electrode pads 5a in the device forming areas 16 (interposer 4) by the plural first bonding wires 8a, respectively. The connection of the first bonding wires 8a is carried out by the nail head bonding method with the first electrode pads 3a of the semiconductor chip 2 as first bonding points and the first electrode pads 5a of the interposer 4 as second bonding points.

Thereafter, as shown in FIG. 10 and FIG. 11, the plural second electrode pads 3b of the semiconductor chip 2 are electrically connected to the plural second electrode pads 5b in the device forming areas 16 (interposer 4) by the plural second bonding wires 8b, respectively. The connection of the second bonding wires 8b is carried out by the nail head bonding method with the second electrode pads 3b of the semiconductor chip 2 as first bonding points and the second electrode pads 5b of the interposer 4 as second bonding points. Connection between the second electrode pads 3b of the semiconductor chip 2 and the one end portions 8b1 of the second bonding wires 8b is carried out at positions farther from the respective sides of the semiconductor chip 2 than connection between the first electrode pads 3a of the semiconductor chip 2 and the one end portions 8a1 of the first bonding wires 8a, and connection between the second electrode pads 5b in the device forming areas (interposer 4) 16 and the other end portions 8b2 of the second bonding wires 8b is carried out at positions farther from the respective sides of the semiconductor chip 2 than connection between the first electrode pads 5a in the device forming areas 16 and the other end portions 8a2 of the first bonding wires 8a. The second bonding wires 8b have a larger loop height than the first bonding wires 8a.

In this step, the one end portions 8b1 of the second bonding wires 8b are connected at positions farther from the first side 2x1 of the semiconductor chip 2 than the one end portions 8a1 of the first bonding wires 8a, and the other end portions 8b2 of the second bonding wires 8b are connected at positions farther from the first side 2x1 of the semiconductor chip 2 than the other end portions 8a2 of the first bonding wires 8a. Therefore, the first bonding wires 8a and the second bonding wires 8b do not overlap with each other in the arrangement direction of the bonding wires 8.

The connection of the second bonding wires 8b which have a larger loop height than the first bonding wires 8a is carried out after the connection of the first bonding wires 8a. Thus, after the connection of the first bonding wires 8a, the second bonding wires 8b which have a larger loop height than the first bonding wires 8a are connected, thereby improving productivity because the set-up for wire bonding becomes easier than when the first and second bonding wires (8a, 8b) are connected alternately.

The second bonding wires 8b are longer than the first bonding wires 8a.

As shown in FIG. 12, the multiple panel 15 is positioned between the upper mold 30a and the lower mold 30b of a mold 30.

The mold 30 is not limited to this but it comprises a cavity 31, a plurality of resin injection gates 32, a plurality of subrunners, a plurality of main runners, a plurality of culls, a connection runner, a plurality of air vents, a plurality of pots and a panel storage area. The cavity 31, the plural resin injection gates 32, the plural subrunners, the plural main runners, the plural culls, connection runner and the plural air vents are formed in the upper mold 30a, and the plural pots and the panel storage area are formed in the lower mold 30b. The cavity 31 is formed in the depth direction from the mating face of the upper mold 30a and the panel storage area is formed in the depth direction from the mating face of the lower mold 30b.

The plane forms of the cavity 31 and the panel storage area correspond to the plane form of the multiple panel 15. Since the plane form of the multiple panel 15 is rectangular in this embodiment, the plane forms of the cavity 31 and the panel storage area are rectangular. The plane size of the cavity 31 is almost the same as the plane size of the molding area, and the plane size of the panel storage area is almost the same as the plane size of the multiple panel 15. The multiple panel 15 is stored in the panel storage area of the lower mold 30b and positioned in the mold 30. When the multiple panel 15 is positioned in the mold 30, the cavity 31 is existent above the main surface of the multiple panel 15.

Subsequently, an epoxy-based thermosetting resin, for example, is injected into the cavity 31 from the pots of the mold 30 through the culls, main runners, subrunners and resin injection gates 32 to seal up the plural semiconductor chips 2 mounted on the main surface of the multiple panel 15 in a lump. As shown in FIG. 14, the resin sealing body 33 which has sealed up the plural semiconductor chips 2 in a lump is formed only on the main surface of the multiple panel 15 by this step.

Since a plurality of resin injection gates 32 are formed along one of the long sides of the cavity 31 so that the resin is uniformly filled into the entire inside of the cavity 31, as shown in FIG. 13, the resin 33a injected into the inside of the cavity 31 flows from the above long side toward the other long side of the cavity 31. Therefore, the macroscopic flow direction 34 of the resin 33a in the inside of the cavity 31 becomes a direction from one long side toward the other long side of the cavity 31.

In this step, groups of the bonding wires 8 arranged in the macroscopic flow direction 34 of the resin 33a (in other words, wires extending in a direction perpendicular to the macroscopic flow direction 34 of the resin 33a) are easily deformed. However, since one end portion 8b1 of the second bonding wire 8b out of adjacent bonding wires is connected at a position farther from the first side 2x1 of the semiconductor chip 2 than the one end portion 8a1 of the first bonding wire 8a, and the other end portion 8b2 of the second bonding wire 8b is connected at a position farther from the first side 2x1 of the semiconductor chip 2 than the other end portion 8a2 of the first bonding wire 8a, a short circuit between the adjacent bonding wires can be suppressed.

The ball-like solder bumps 10 are then formed on the main surfaces of the plural electrode pads 6 arranged on the rear surface of the multiple panel 15. The solder bumps 10 are formed, for example, by supplying ball-like solder materials by a ball supplying method and heating them.

Thereafter, the resin sealing body 33 for sealing up the plural semiconductor chips 2 in a lump is affixed to a dicing sheet 26 and then the plural device areas 16 of the multiple panel 15 are separated from one another together with the resin sealing body 33 as shown in FIG. 15. This separation is carried out by a dicing machine. The semiconductor device 1 shown in FIG. 1 and FIG. 2 is almost completed by this step.

The production of the semiconductor chip 2 will be described hereinbelow with reference to FIGS. 16 to 19.

Figure 16:
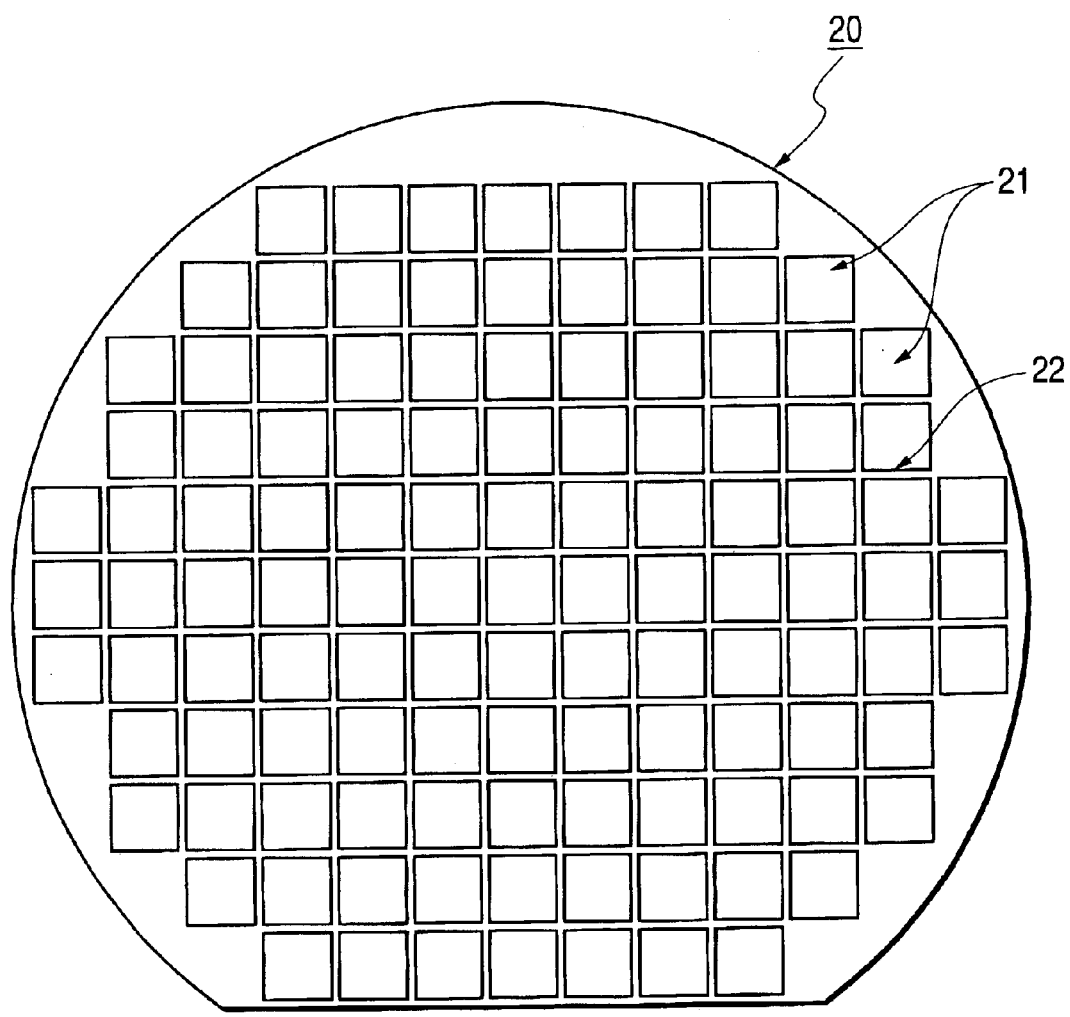
FIG. 16 is a plan view of a semiconductor wafer of Embodiment 1.
Figure 17:
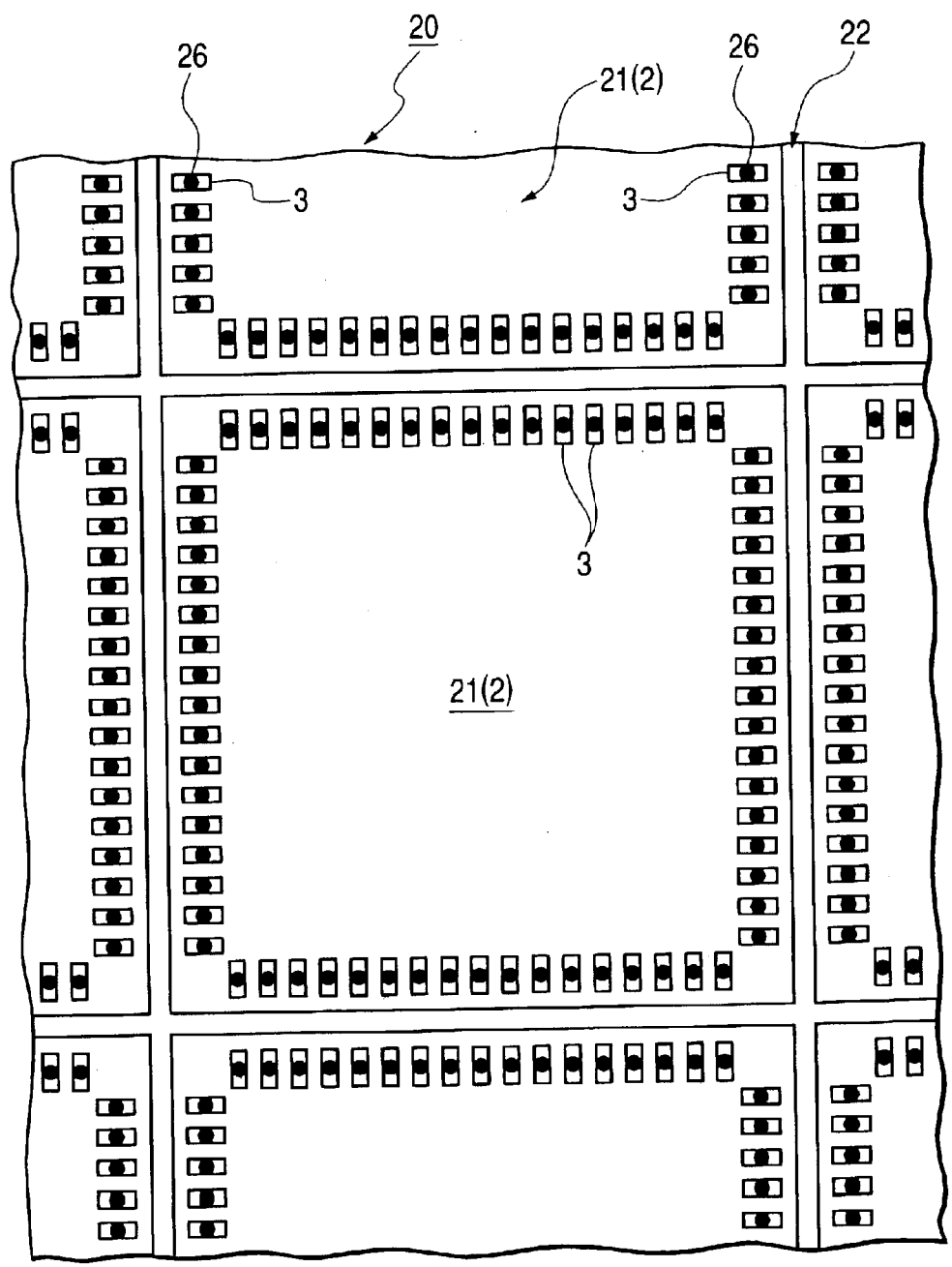
FIG. 17 is a partially enlarged plan view of FIG. 16.
Figure 18:
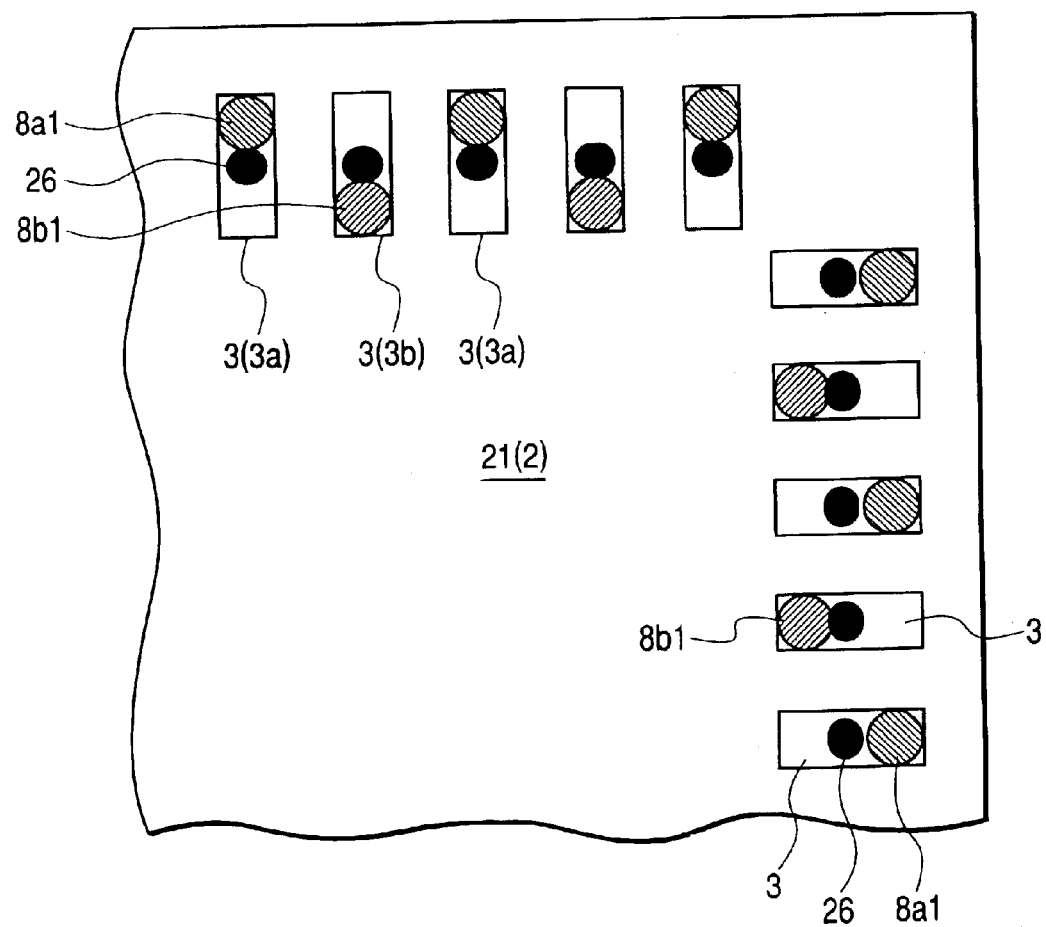
FIG. 18 is a partially enlarged plan view of FIG. 17.
Figure 19:
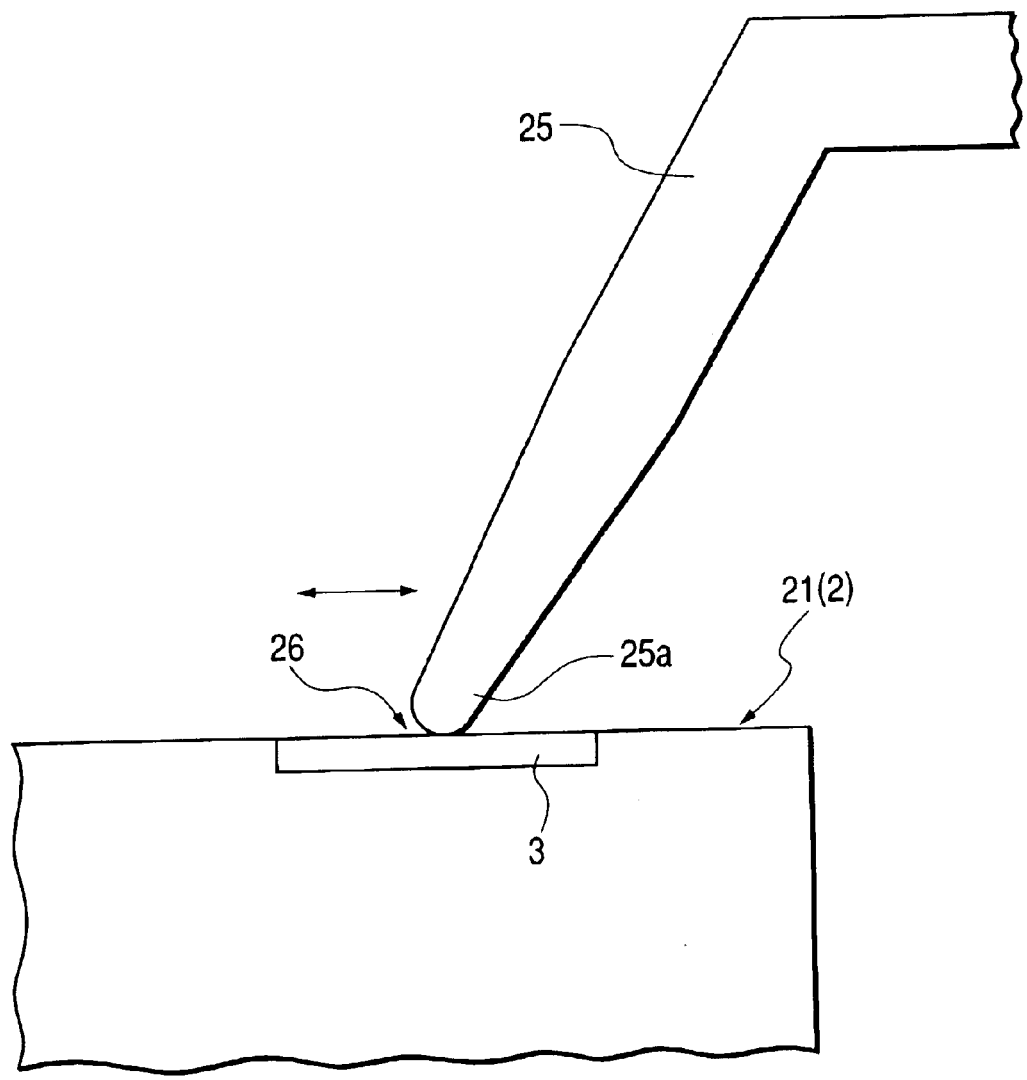
FIG. 19 is a diagram for explaining a characteristic inspection step in the production of the semiconductor device of Embodiment 1.

FIG. 16 is a plan view of a semiconductor wafer, FIG. 17 is a partially enlarged plan view of FIG. 16, FIG. 18 is a partially enlarged plan view of FIG. 17 and FIG. 19 is a diagram for explaining a characteristics inspection step.

The semiconductor wafer 20 made from monocrystal silicon is prepared, and the main surface of the semiconductor wafer 20 is subjected to a wafer pretreatment step for forming a semiconductor device such as a field effect transistor, a wiring layer and an insulating film in order to form a plurality of chip forming areas 21 having a control circuit as an integrated circuit in a matrix form as shown in FIG. 16. The plural chip forming areas 21 are defined by dividing areas 22 for specifying the boundaries thereof and spaced apart from one another. The plural chip forming areas 22 are produced by forming a semiconductor device, multilayer wiring laminate, electrode pads 3, surface protective film and openings on the main surface of the semiconductor wafer 20.

Thereafter, probe inspection is carried out by using a probe card. The probe inspection is carried out by first aligning the semiconductor wafer 20 with the probe card and coming the end portion 25a of the probe needle 25 of the probe card into contact with one of the plural electrode pads 3 in the chip forming area 21 of the semiconductor wafer 20. Then, the electric properties of the circuit in the chip forming area 21 are measured with a tester electrically connected to the probe needle 25 of the probe card. This step is carried out for each chip forming area 21. Thereby, whether the chip forming area 21 is accepted or not and the grade of electric properties such as operation frequency of the chip forming area 21 are judged.

In this step, as shown in FIG. 17 and FIG. 18, a scratch, that is, a contact mark 26 is formed on the connection surface of the electrode pad 3 by the contact of the probe needle 25. Since this contact mark 26 deteriorates bonding between the electrode pad 3 and the one end portion of the bonding wire 8, it is necessary to prevent the contact mark 26 from being formed in the area where one end portion of the bonding wire 8 is connected as much as possible.

In this embodiment, the electrode pads 3 have a rectangular plane form that their two long opposite sides extend in a direction away from the respective sides of the semiconductor chip 2 and their short opposite sides extend along the respective sides of the semiconductor chip 2. Therefore, the contact marks 26 can be formed at positions farther from the sides of the semiconductor chip 2 than the one end portions of the first bonding wires 8a and closer to the sides of the semiconductor chip 2 than the one end portions of the second bonding wires 8b by setting the length of the long sides of the electrode pad 3 to twice or more the length of the long sides of the electrode pads 3 in the connection areas between the electrode pad 3 and one end portions of the bonding wires 8, thereby making it possible to prevent the contact marks 26 from being formed in the areas where one end portions of the bonding wires 8 are connected. Also, as it is possible to prevent the contact marks 26 from being formed in the areas where one end portions of the bonding wires 8 are connected without arranging the distal end portions 25a of the probe needles 25 in a zigzag form, a probe test can be carried out by using the existing probe card.

Then, the dividing areas 22 of the semiconductor wafer 20 are diced with the dicing machine to divide the semiconductor wafer 20 into chip forming areas 21. Thereby, semiconductor chips 2 are formed.

Figure 20:
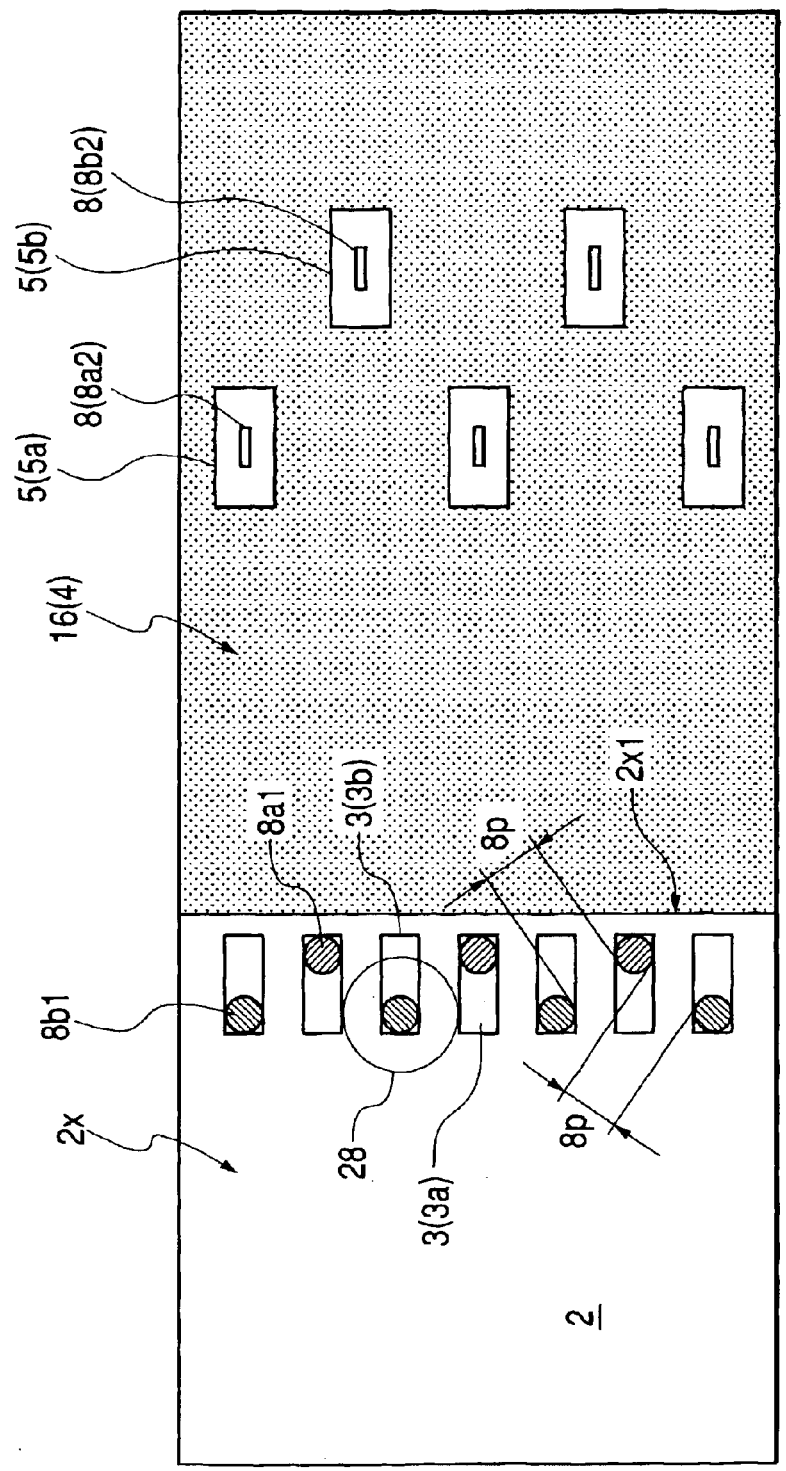
FIG. 20 is a diagram showing the positions of connecting portions when the electrode pads of the semiconductor chip and the one end portions of the bonding wires are connected to each other in a zigzag manner.

FIG. 20 is a diagram showing the positions of the connecting portions when the electrode pads 3 of the semiconductor chip 2 and the one end portions of the bonding wires 8 are connected to each other in a zigzag manner.

Figure 21:
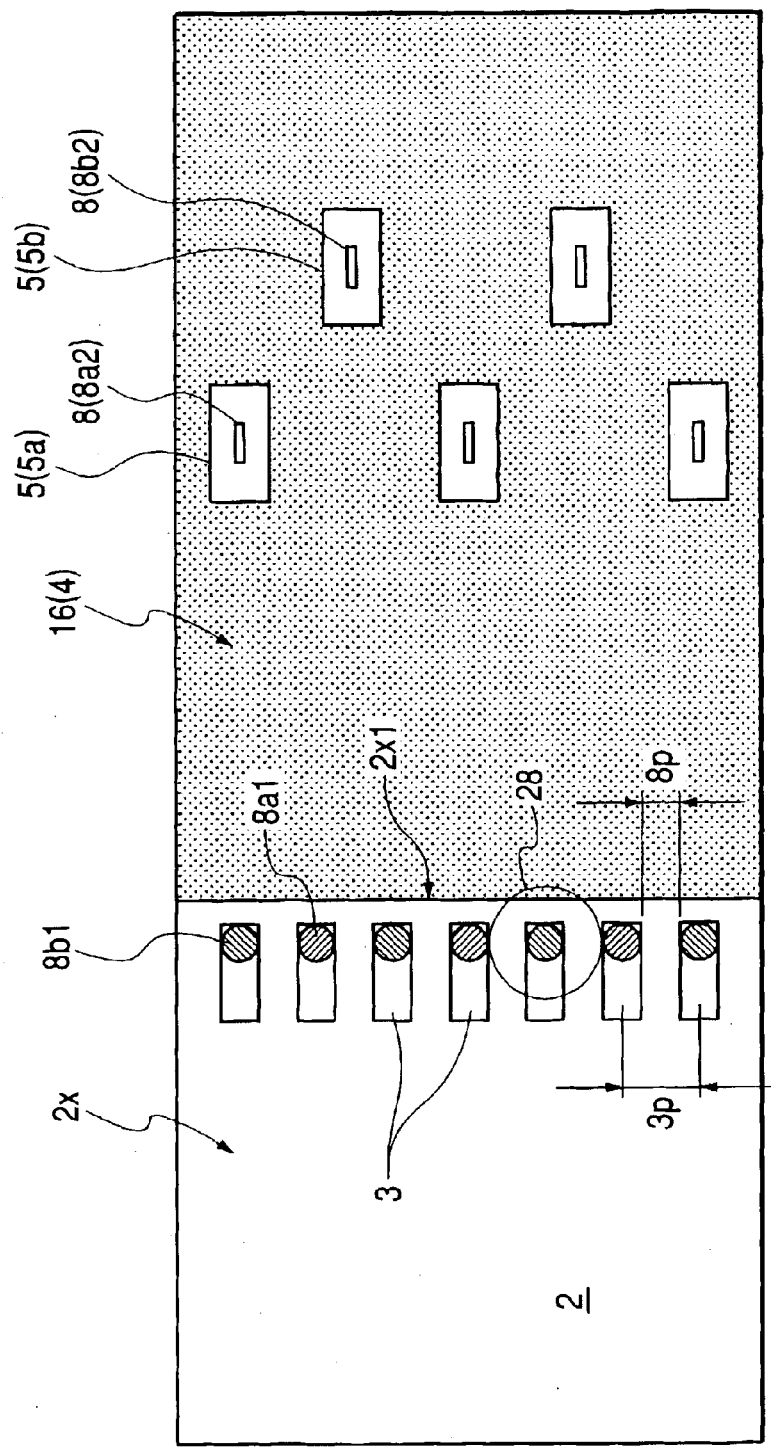
FIG. 21 is a diagram showing the positions of connecting portions when the electrode pads of the semiconductor chip and the one end portions of the bonding wires are connected to each other linearly.

FIG. 21 is a diagram showing the positions of the connecting portions when the electrode pads 3 of the semiconductor chip 2 and the one end portions of the bonding wires 8 are connected to each other linearly.

As shown in FIG. 20 and FIG. 21, the distance 8p between the one end portion 8a1 of the first bonding wire 8a connected to the first electrode pad 3a and the one end portion 8b1 of the second bonding wire 8b connected to the second electrode pad 3b adjacent to the first electrode pad 3a is wider when the electrode pads 3 of the semiconductor chip 2 are connected to the one end portions of the bonding wires 8 in a zigzag manner than when the electrode pads 3 of the semiconductor chip 2 are connected to the one end portions of the bonding wires 8 linearly. When the pitches of the electrode pads are the same, the end portion 28 of a capillary is brought into contact with the one end portions of the adjacent bonding wires 3 in FIG. 21 whereas the end portion 28 of the capillary does not contact the one end portions of the adjacent bonding wires in FIG. 22.

Therefore, the deformation of the wires caused by the interference of the capillary at the time of wire bonding can be suppressed without widening the interval between adjacent electrode pads 3.

Since the distance 8p can be increased without widening the pitch of the electrode pads 3, the pitch 3p of the electrode pads 3 can be narrowed by the increase in the distance 3p. As a result, the plane size of the semiconductor chip 2 can be reduced, thereby making it possible to downsize the BGA type semiconductor device 1.

(Embodiment 2)

Figure 22:
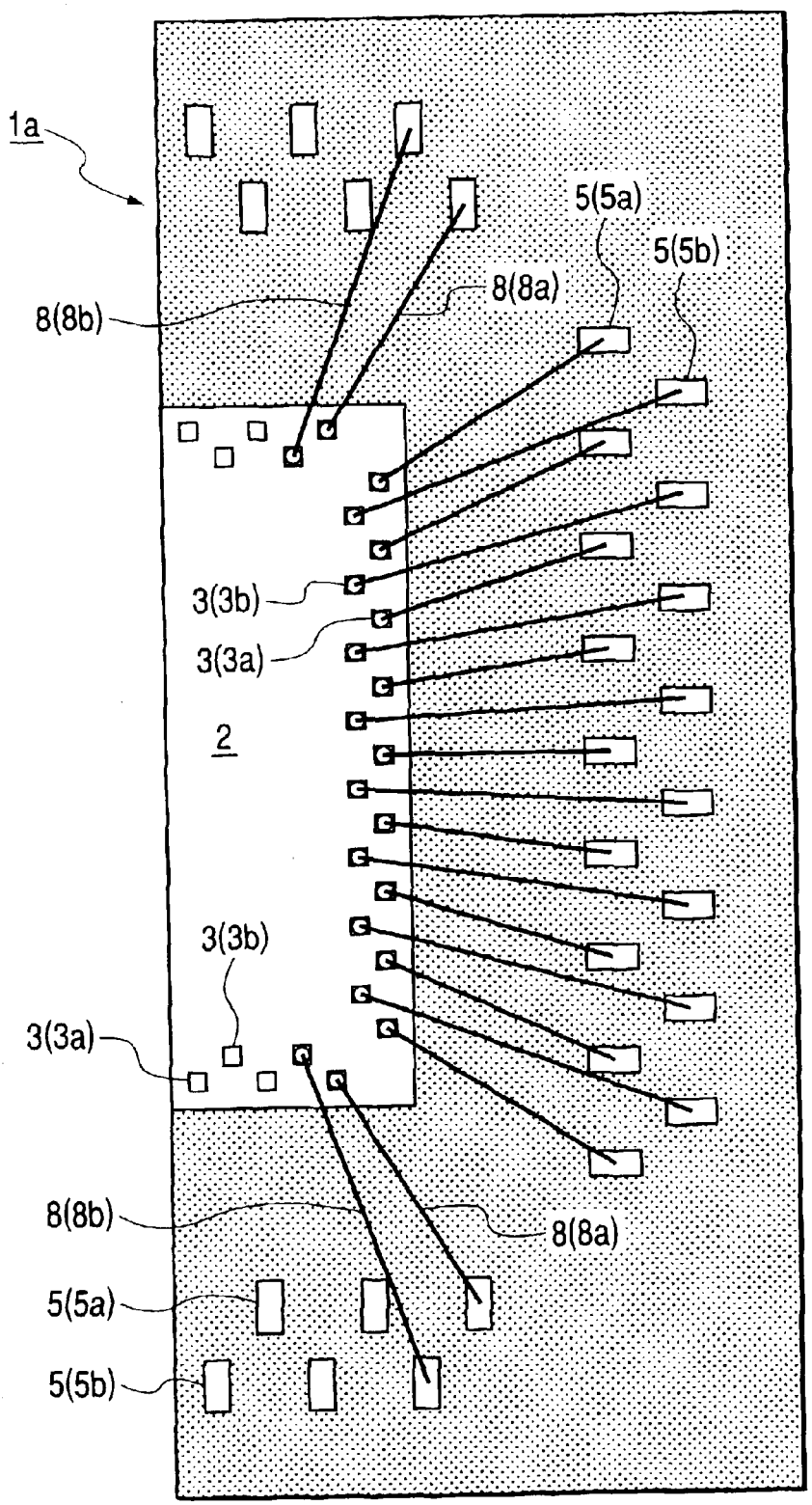
FIG. 22 is a plan view of the key section of a semiconductor device according to Embodiment 2 of the present invention.
Figure 23:
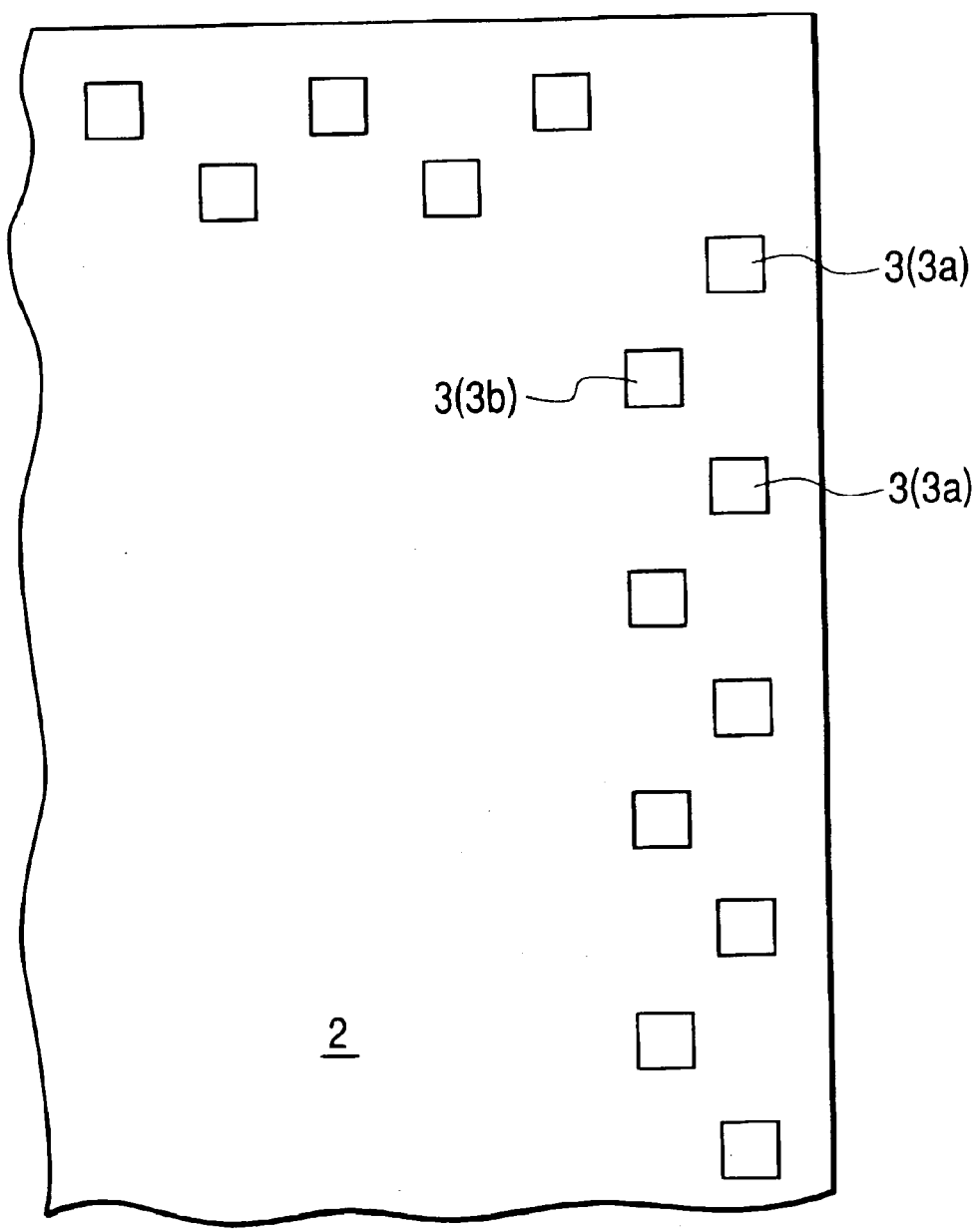
FIG. 23 is a plan view of the key section of the semiconductor chip of FIG. 22.

FIG. 22 is a plan view of the key section of a BGA type semiconductor device according to Embodiment 2 of the present invention, and FIG. 23 is a plan view of the key section of the semiconductor chip of FIG. 22.

As shown in FIG. 22 and FIG. 23, the BGA type semiconductor device 1a of this Embodiment 2 is basically the same as the above Embodiment in constitution but differs from the above Embodiment in the following.

That is, a plurality of electrode pads 3 are arranged on the main surface of the semiconductor chip 2 along each side of the semiconductor chip 2 and consist of first electrode pads 3a and second electrode pads 3b adjacent to the first electrode pads 3a and farther from the respective sides of the semiconductor chip 2 than the first electrode pads 3a, all of which are arranged alternately in a zigzag manner. The plane form of the electrode pads 3 is, for example, square.

Even when this semiconductor chip 2 is used, the same effect as in the above Embodiment 1 is obtained.

In this embodiment, the end portions 25a of the probe needles 25 must be arranged in a zigzag manner, thereby making it difficult to use existing probe cards.

(Embodiment 3)

Figure 24:
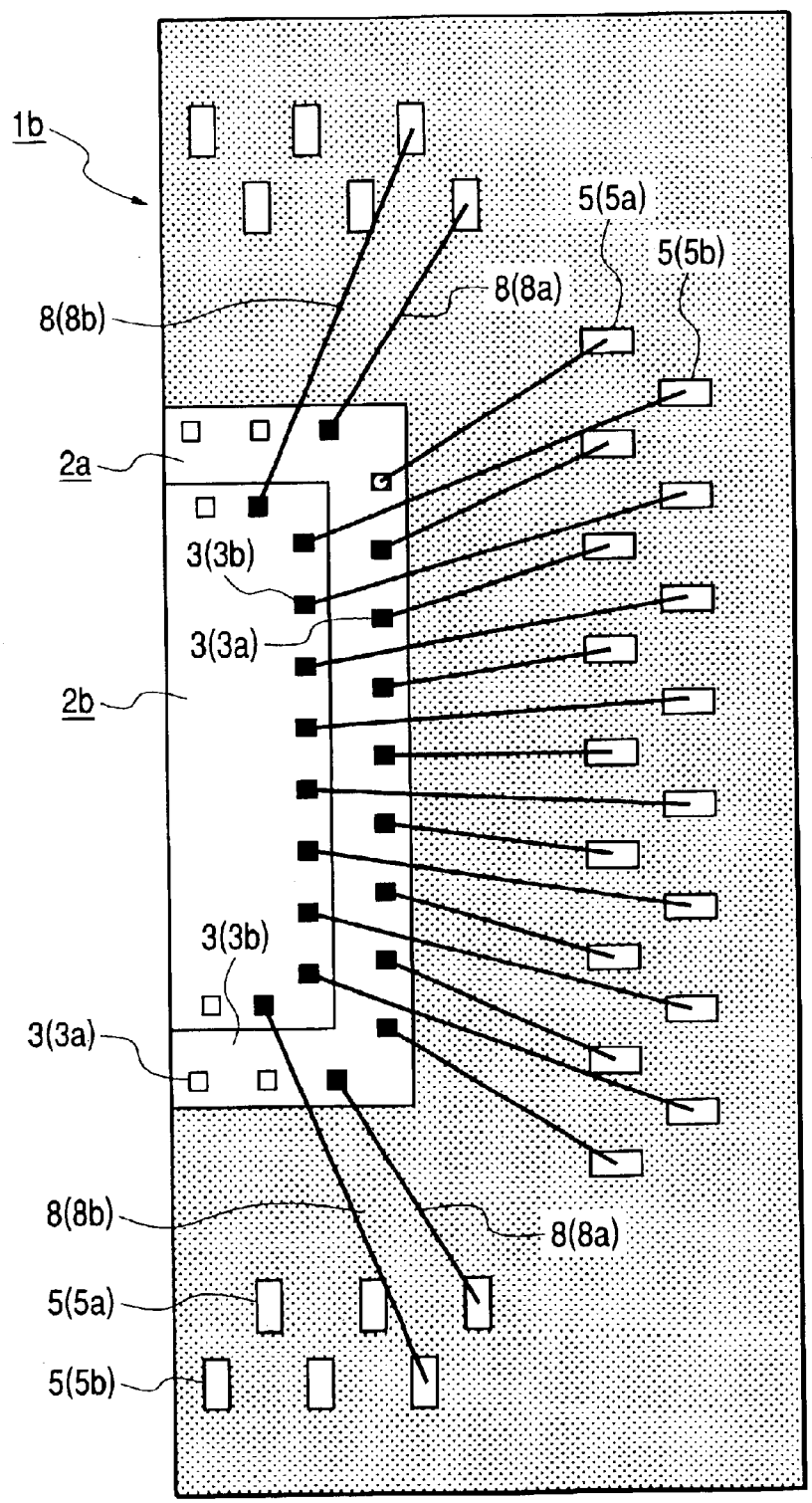
FIG. 24 is a partial plan view showing the internal structure of a semiconductor device according to Embodiment 3 of the present invention.

FIG. 24 is a plan view of the key section of a BGA type semiconductor device according to Embodiment 3 of the present invention, and FIG. 25 is a sectional view of the key section of the semiconductor device of FIG. 24.

As shown in FIG. 24 and FIG. 25, the BGA type semiconductor device 1b of this Embodiment 3 is the same as the above Embodiment 1 in constitution but differs from the above Embodiment 1 in that the semiconductor chip sealed up with the resin sealing body 9 has a laminate structure.

A second semiconductor chip 2b is formed on a first semiconductor chip 2a by an adhesive layer 7, and the electrode pads 3a of the first semiconductor chip 2a and the electrode pads 3b of the second semiconductor chip 2b are arranged in a zigzag manner like Embodiments 1 and 2.

The above second semiconductor chip 2b is made as thin as 0.1 mm or less, for example, to reduce the thickness of the resin sealing body 9 as much as possible. When the semiconductor chip is made thin, the electrode pads of the upper and lower semiconductor chips become close to each other. However, when the electrode pads are arranged in the same manner as in Embodiments 1 and 2, contact between wires can be prevented.

Consequently, a semiconductor package which is thin and has high electric reliability can be provided.

While the invention made by the inventors of the present invention has been described based on the above Embodiments, it is needless to say that the present invention is not limited to the above embodiments and that various changes and modifications may be made in the invention without departing from the spirit and scope thereof.

Effects obtained by a typical one of the inventions disclosed by the present application are briefly described below.

According to the present invention, a short circuit between adjacent bonding wires can be suppressed.

According to the present invention, the size of a semiconductor device can be reduced.

What is claimed is:

1. A semiconductor device comprising:

a semiconductor chip;

a wiring substrate having the semiconductor chip mounted on a main surface;

a plurality of electrode pads, each having a first connection end and a second connection end, arranged on a main surface of the semiconductor chip along at least one side of the semiconductor chip, the first connection ends being closer to the side of the semiconductor chip than the second connection ends;

a plurality of connecting portions arranged in a first row and a second row on the main surface of the wiring substrate between the side of the semiconductor chip and an outer edge of the wiring substrate, the first row being closer to the side of the semiconductor chip than the second row;

a plurality of wires, connected to the plurality of electrode pads and the plurality of connecting portions, to connect each of the first row connecting portions to the first connection end of a corresponding electrode pad, and to connect each of the second row connecting portions to the second connection end of a corresponding electrode pad; and a resin sealing body sealing up the semiconductor chip and the plurality of wires.

2. The semiconductor device according to claim 1, wherein each of the plurality of electrode pads has a rectangular form including two long opposite sides extending in a direction away from the side of the semiconductor chip.

3. The semiconductor device according to claim 1, wherein the plurality of electrode pads are arranged in a single row.

4. The semiconductor device according to claim 3, wherein the plurality of electrode pads are alternatingly connected to the first and second rows of the connecting portions.

5. The semiconductor device according to claim 4, wherein the first and second rows of the connecting portions are arranged in a zigzag manner.

6. The semiconductor device according to claim 1, wherein the plurality of connecting portions are arranged in a zigzag manner by placing the first row of connecting portions and the second row of connecting portions alternatingly.

7. The semiconductor device according to claim 1, wherein the pitch of the plurality of electrode pads is narrower than the pitch of the plurality of connecting portions.

8. The semiconductor device according to claim 1, wherein the wires connecting the first row of connecting portions to the plurality of electrode pads are shorter than the wires connecting the second row of connecting portions to the plurality of electrode pads.

9. The semiconductor device according to claim 1, wherein the plurality of wires are connected to the plurality of electrode pads and the plurality of connecting portions using nail head bonding.

10. The semiconductor device according to claim 1, wherein the resin sealing body is formed by transfer molding.

11. The semiconductor device according to claim 1, wherein each of the plurality of electrode pads includes:

a rectangular form having two long opposite sides extending in a direction away from the side of the semiconductor chip, and a bonding surface having a probe needle contact mark formed between the first and second connection ends of the electrode pad.

12. The semiconductor device according to claim 11, wherein the long sides of each of the plurality of electrode pads are longer than a first connection end length and a second connection end length combined.

13. The device according to claim 1, wherein a loop height of the wires attached to the first row of connecting portions is smaller than a loop height of the wires attached to the second row of connecting portions.

* * * * *